(12) United States Patent
Yu et al.

(10) Patent No.: US 10,872,865 B2
(45) Date of Patent: Dec. 22, 2020

(54) ELECTRIC MAGNETIC SHIELDING STRUCTURE IN PACKAGES

(71) Applicant: Taiwan Semiconductor Manufacturing Company, Ltd., Hsin-Chu (TW)

(72) Inventors: Chen-Hua Yu, Hsin-Chu (TW); Shin-Puu Jeng, Hsin-Chu (TW); Der-Chyang Yeh, Hsin-Chu (TW); Hsien-Wei Chen, Hsin-Chu (TW); Jie Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 741 days.

(21) Appl. No.: 15/285,140

(22) Filed: Oct. 4, 2016

(65) Prior Publication Data
US 2017/0025364 A1 Jan. 26, 2017

Related U.S. Application Data

(63) Continuation of application No. 14/472,681, filed on Aug. 29, 2014, now Pat. No. 9,461,025, which is a
(Continued)

(51) Int. Cl.
*H05K 3/30* (2006.01)
*H05K 3/40* (2006.01)
(Continued)

(52) U.S. Cl.
CPC ...... *H01L 23/552* (2013.01); *H01L 21/32051* (2013.01); *H01L 21/568* (2013.01); *H01L 21/6835* (2013.01); *H01L 21/7684* (2013.01); *H01L 21/76885* (2013.01); *H01L 23/5383* (2013.01); *H01L 23/5384* (2013.01); *H01L 23/5389* (2013.01); *H01L 23/585* (2013.01); *H01L 24/19* (2013.01); *H01L 24/20* (2013.01);
(Continued)

(58) Field of Classification Search
CPC ............ H05K 3/284; H05K 3/32; H05K 3/30; H05K 3/46; H05K 3/40; H01L 23/5383; H01L 23/552; H01L 23/5389; H01L 23/5384; H01L 21/568; H01L 21/302; H01L 21/6835; H01L 21/32051; H01L 21/7684; H01L 21/76885; H01L 24/19; H01L 24/20; H01L 24/48; H01L 25/105; Y10T 29/49146; Y10T 29/4913; Y10T 29/49155; Y10T 29/49165
USPC .......... 29/841, 829, 832, 852, 848, 849, 846
See application file for complete search history.

(56) References Cited

U.S. PATENT DOCUMENTS 6,582,991 B1 * 6/2003 Maeda .................... H01L 24/81
438/107
7,142,126 B2 11/2006 Jeon
(Continued)

*Primary Examiner* — Peter Dungba Vo
*Assistant Examiner* — Kaying Kue
(74) *Attorney, Agent, or Firm* — Slater Matsil, LLP

(57) ABSTRACT

A package includes a device die, a molding material molding the device die therein, and a through-via penetrating through the molding material. A redistribution line is on a side of the molding material. The redistribution line is electrically coupled to the through-via. A metal ring is close to edges of the package, wherein the metal ring is coplanar with the redistribution line.

20 Claims, 33 Drawing Sheets

Related U.S. Application Data continuation-in-part of application No. 13/926,938, filed on Jun. 25, 2013, now Pat. No. 9,337,073.

(60) Provisional application No. 61/778,291, filed on Mar. 12, 2013.

(51) Int. Cl.

| | |
|---|---|
| *H01L 21/56* | (2006.01) |
| *H01L 21/58* | (2006.01) |
| *H01L 23/552* | (2006.01) |
| *H01L 23/538* | (2006.01) |
| *H01L 23/00* | (2006.01) |
| *H01L 21/683* | (2006.01) |
| *H01L 25/10* | (2006.01) |
| *H01L 21/3205* | (2006.01) |
| *H01L 21/768* | (2006.01) |
| *H01L 23/58* | (2006.01) |
| *H01L 23/498* | (2006.01) |

(52) U.S. Cl.
CPC ...... *H01L 25/105* (2013.01); *H01L 23/49816* (2013.01); *H01L 24/16* (2013.01); *H01L 24/32* (2013.01); *H01L 24/48* (2013.01); *H01L 24/73* (2013.01); *H01L 24/81* (2013.01); *H01L 24/92* (2013.01); *H01L 2221/68359* (2013.01); *H01L 2221/68363* (2013.01); *H01L 2221/68372* (2013.01); *H01L 2224/12105* (2013.01); *H01L 2224/16225* (2013.01); *H01L 2224/32225* (2013.01); *H01L 2224/32245* (2013.01); *H01L 2224/48227* (2013.01); *H01L 2224/73253* (2013.01); *H01L 2224/73265* (2013.01); *H01L 2224/73267* (2013.01); *H01L 2224/81005* (2013.01); *H01L 2224/92244* (2013.01); *H01L 2225/1035* (2013.01); *H01L 2225/1058* (2013.01); *H01L 2924/00014* (2013.01); *H01L 2924/12042* (2013.01); *H01L 2924/14* (2013.01); *H01L 2924/1431* (2013.01); *H01L 2924/15311* (2013.01); *H01L 2924/181* (2013.01); *H01L 2924/18161* (2013.01); *H01L 2924/3025* (2013.01)

(56) References Cited

U.S. PATENT DOCUMENTS

| | | | |
|---|---|---|---|
| 7,172,015 B2 | 2/2007 | Miura et al. | |
| 7,381,906 B2 | 6/2008 | Holmberg | |
| 7,518,067 B2 | 4/2009 | Gupta et al. | |
| 7,547,975 B2* | 6/2009 | Takaya | H01L 24/82 257/778 |
| 7,557,307 B2 | 7/2009 | Nishizawa et al. | |
| 8,101,868 B2* | 1/2012 | Ito | H01L 24/24 174/260 |
| 8,292,014 B2 | 10/2012 | Sugiyama | |
| 8,729,679 B1 | 5/2014 | Phua | |
| 9,027,238 B2* | 5/2015 | Ito | H01L 24/83 29/841 |
| 2003/0116843 A1* | 6/2003 | Iijima | H05K 1/187 257/700 |
| 2004/0231872 A1 | 11/2004 | Arnold et al. | |
| 2005/0150106 A1* | 7/2005 | Long | H01F 41/041 29/830 |
| 2006/0003495 A1* | 1/2006 | Sunohara | H01L 24/82 438/124 |
| 2006/0021791 A1* | 2/2006 | Sunohara | H01L 23/5389 174/255 |
| 2011/0278703 A1 | 11/2011 | Pagaila et al. | |
| 2012/0075821 A1 | 3/2012 | Pagaila | |
| 2012/0139092 A1 | 6/2012 | Su et al. | |
| 2014/0225208 A1 | 8/2014 | Gu et al. | |
| 2014/0262475 A1 | 9/2014 | Liu et al. | |
| 2014/0367160 A1 | 12/2014 | Yu et al. | |

* cited by examiner

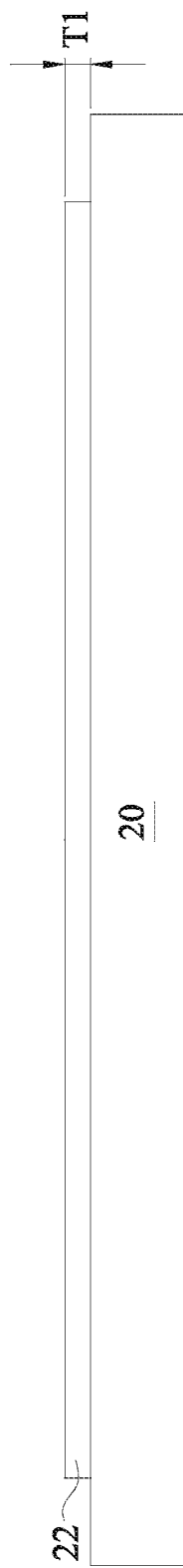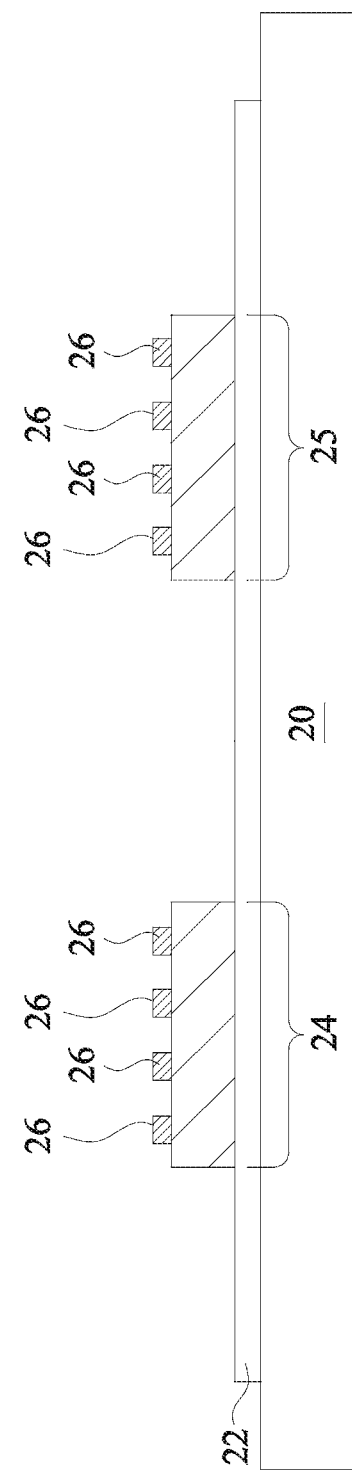

ELECTRIC MAGNETIC SHIELDING STRUCTURE IN PACKAGES

PRIORITY CLAIM AND CROSS-REFERENCE

This application is a continuation of U.S. patent application Ser. No. 14/472,681, filed on Aug. 29, 2014, and entitled "Electric Magnetic Shielding Structure in Packages," which application is a continuation-in-part application of the commonly-assigned U.S. patent application Ser. No. 13/926,938, filed Jun. 25, 2013, and entitled "3D Shielding Case and Methods for Forming the Same," now U.S. Pat. No. 9,337, 073, issued May 10, 2016, which claims the benefit of U.S. Provisional Application Ser. No. 61/778,291, entitled "3D Shielding Case and Methods for Forming the Same," filed Mar. 12, 2013, which applications are hereby incorporated herein by reference.

BACKGROUND

Electro-Magnetic Interference (EMI) is a common problem in the applications of integrated circuits. The EMI becomes a more severe issue in the applications in which high frequencies are used, for example, in mobile applications in which Radio Frequency (RF) signals are used.

To reduce the EMI between device dies, metal shielding cases are used to shield the device dies. The metal shielding cases are typically formed of iron using stamping process. The metal shielding cases are designed to fit the sizes and the shapes of the device dies that are to be shielded. After the dies are bonded to a Printed Circuit Board, the metal shielding cases are covered on the dies, and are soldered to the PCB. The metal shielding cases provide a two-way shielding, and prevent the dies from interfering with the devices outside of the shielded dies, and prevent the outside devices from interfering with the devices in the shielded dies.

In the conventional metal shielding scheme, the metal shielding cases have to be customized to the shapes and the sizes of dies. With multiple dies on a PCB, which dies have different sizes, a plurality of metal shielding cases with different design is needed. This results in a significant increase in the manufacturing cost of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 15 are cross-sectional views and top views of intermediate stages in the manufacturing of a package in accordance with some exemplary embodiments, wherein shielding cases are formed during the packaging process;

DETAILED DESCRIPTION

Figure 3:
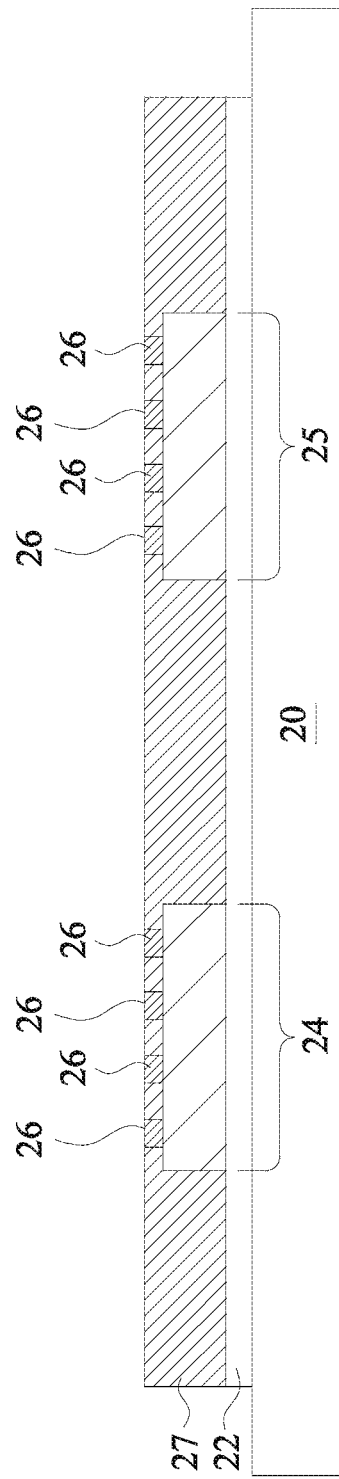
Figure 4:
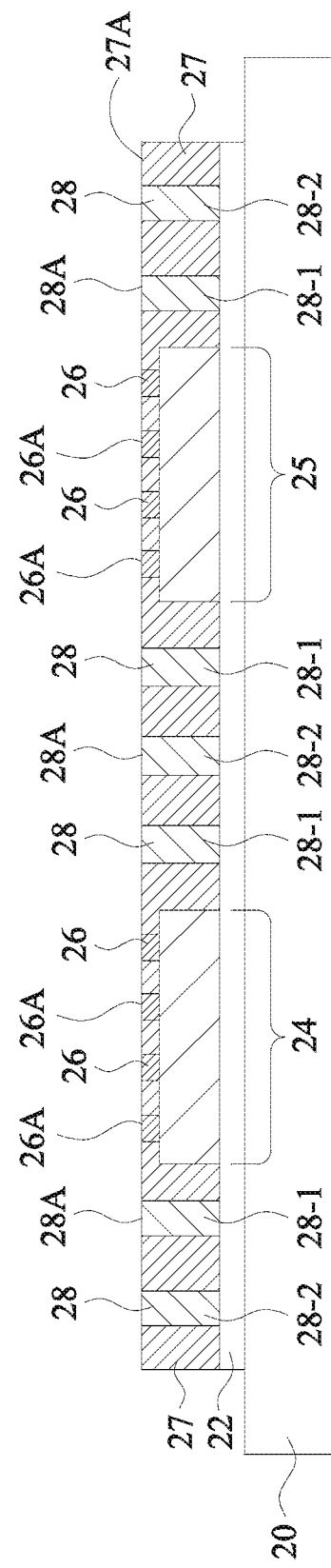

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A built-in metal shielding case and the method of forming the same are provided in accordance with various exemplary embodiments. The intermediate stages of forming the metal shielding case in a packaging process are illustrated. The variations of the metal shielding case are discussed. Throughout the various views and illustrative embodiments, like reference numbers are used to designate like elements.

FIGS. 1 through 15 are cross-sectional views and top views of intermediate stages in the manufacturing of a package including a built-in metal shielding case in accordance with some exemplary embodiments. FIG. 1 illustrates carrier 20, and metal foil 22 on carrier 20. Carrier 20 may be a glass carrier, a ceramic carrier, or the like. Metal foil 22 may be a copper foil, for example, although it may also be formed of other conductive materials. Thickness T1 of Metal foil 22 may be between about 1 µm and about 20 µm. It is appreciated, however, that the values recited throughout the description are merely examples, and may be changed to different values. In some embodiments, there is an adhesive layer (not shown) used for attaching metal foil 22 to carrier 20. The adhesive layer may be formed of, for example, an Ultra-Violet (UV) glue.

FIG. 2 illustrates the placement of device dies 24 and 25. Device dies 24 and 25 are placed with the back surfaces facing metal foil 22, and hence the back surfaces of dies 24 and 25 are level with each other. Device dies 24 and 25 may be logic device dies including logic transistors therein. In some exemplary embodiments, device dies 24 and 25 are dies that are designed for mobile applications, and may include a Power Management Integrated Circuit (PMIC) die and a Transceiver (TRX) die, for example. Although two dies 24 and 25 are illustrated, more dies may be placed over metal foil 22 and level with each other. Furthermore, there may be an array of dies 24 identical to each other and an array of dies 25 identical to each other, wherein each pair of dies 24 and 25 will be used to form a package.

In some exemplary embodiments, metal bumps 26 (such as copper posts) are formed as the top portions of device dies 24 and 25, and are electrically coupled to the devices in device dies 24 and 25. Metal bumps 26 may protrude over the remaining portions of dies 24 and 25. Metal bumps 26 are electrically connected to the integrated circuit devices in dies 24 and 25. Throughout the description, the sides of dies 24 and 25 with metal bumps 26 are referred to as the front sides.

Referring to FIG. 3, molding material 27 is molded on device dies 24 and 25. Molding material 27 fills the gaps between device dies 24 and 25, and may be in contact with metal foil 22. Furthermore, molding material 27 may be filled into the gaps between metal bumps 26. Molding material 27 may include a molding compound, a molding underfill, an epoxy, or a resin. The top surface of molding material 27 is higher than the top ends of metal bumps 26. Next, a thinning step, which may be a grinding step, is performed to thin molding material 27, until metal bumps 26 are exposed.

Next, conductive posts 28 are formed in molding material 27. Throughout the description, conductive posts 28 are alternatively referred to as Through-Assembly Vias (TAVs) 28. In some embodiments, TAVs 28 may be formed by plating. The exemplary formation process of TAVs 28 may include forming openings (occupied by TAVs 28) in molding material 27 until metal foil 22 is exposed, and plating TAVs 28 in the openings. The material of TAVs 28 may include copper, aluminum, or the like. In the resulting structure in FIG. 2, the bottom ends of TAVs 28 are substantially level with the bottom surface of device dies 24 and 25. In some embodiments, a planarization is performed to level the top ends 28A of TAVs 28 with the top ends 26A of metal bumps 26, and with top surface 27A of molding material 27. TAVs 28 may include metal posts 28-1 and 28-2, wherein the top view shapes of TAVs 28-1 and 28-2 are illustrated in FIG. 10.

Figure 5:
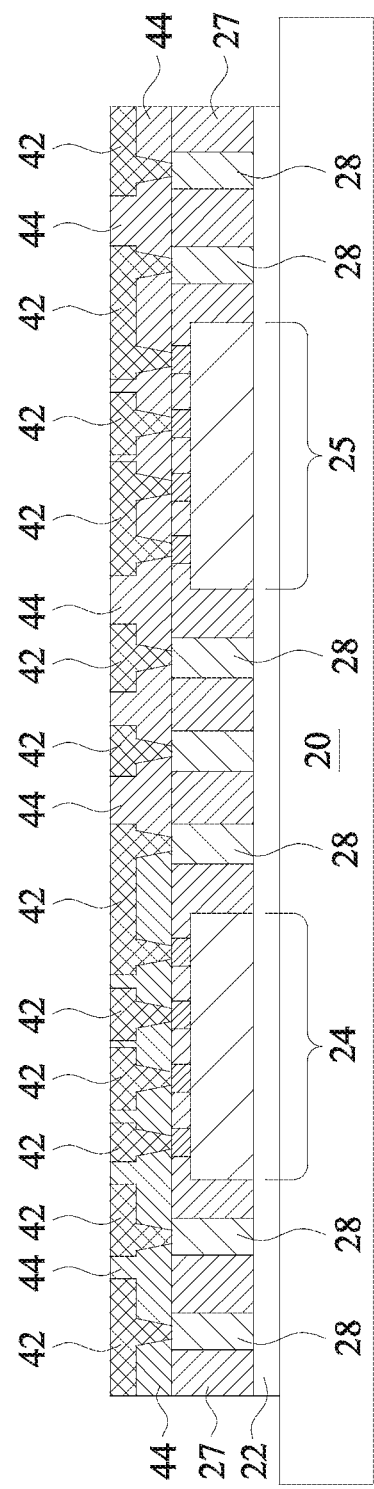

Next, referring to FIG. 5, Redistribution Lines (RDLs) 42 are formed over molding material 27 to connect to metal bumps 26 and TAVs 28. RDLs 42 may also interconnect metal bumps 26 and TAVs 28. RDLs 42 are formed in dielectric layers 44. In some embodiments, RDLs 42 are formed by depositing metal layers, patterning the metal layers, and filling the gaps between RDLs 42 with dielectric layers 44. In alternative embodiments, RDLs 42 and dielectric layers 44 are formed using damascene processes. RDLs 42 may comprise a metal or a metal alloy including aluminum, copper, tungsten, and/or alloys thereof.

Figure 6:
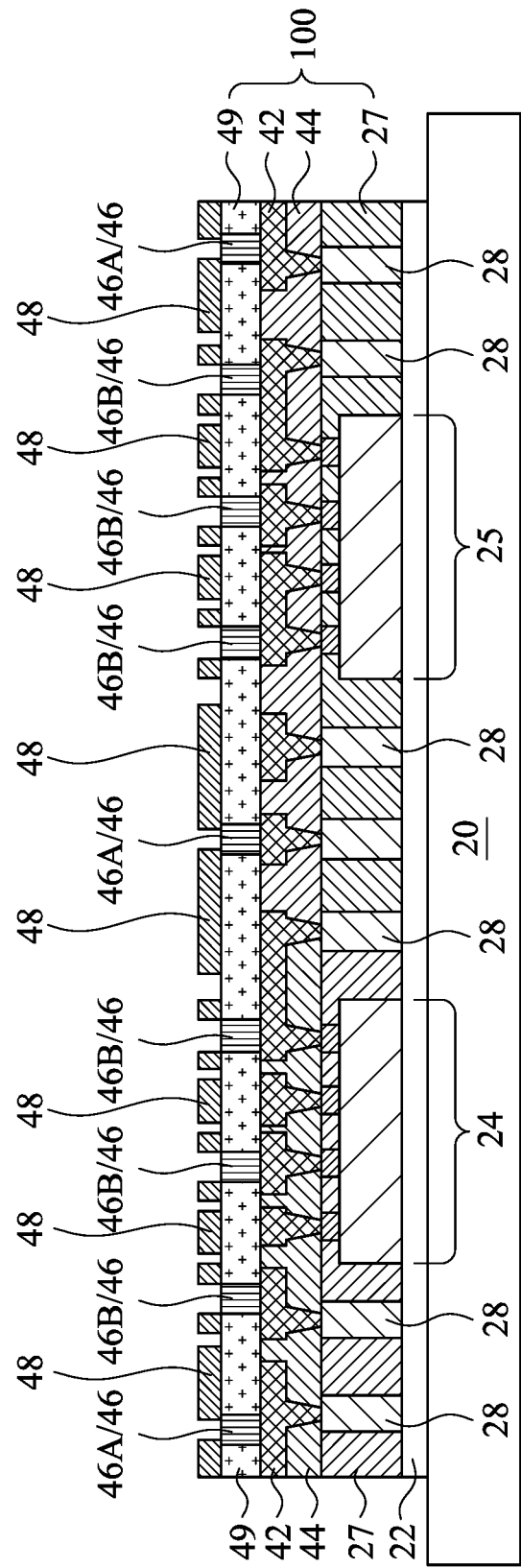

FIG. 6 illustrates the formation of Under-Bump Metallurgies (UBM) 46 (including 46A and 46B) and ground mesh 48. Throughout the description, the terms "ground mesh" and "metal mesh" are interchangeably used. The formation of UBMs 46 and ground mesh 48 may include forming and patterning dielectric layer 49 over the structure in FIG. 5, and depositing a seed layer (such as a titanium layer and an overlying copper layer, which are not shown) over dielectric layer 49. A patterned photo resist (not shown) is then formed over the seed layer, and a metallic material is plated in the patterned photo resist. The photo resist is then removed, and the portions of the seed layer covered by the photo resist are removed. The remaining portions of the plated metallic material form UBMs 46 and ground mesh 48. UBMs 46A are physically and electrically connected to ground mesh 48, and may be used for electrical grounding and heat dissipation. UBMs 46B are physically disconnected and electrically insulated from ground mesh 48, and may be used for the connection of signal-transmission lines. Throughout the description, the structure shown in FIG. 6 is referred to as composite wafer 100.

Figure 7:
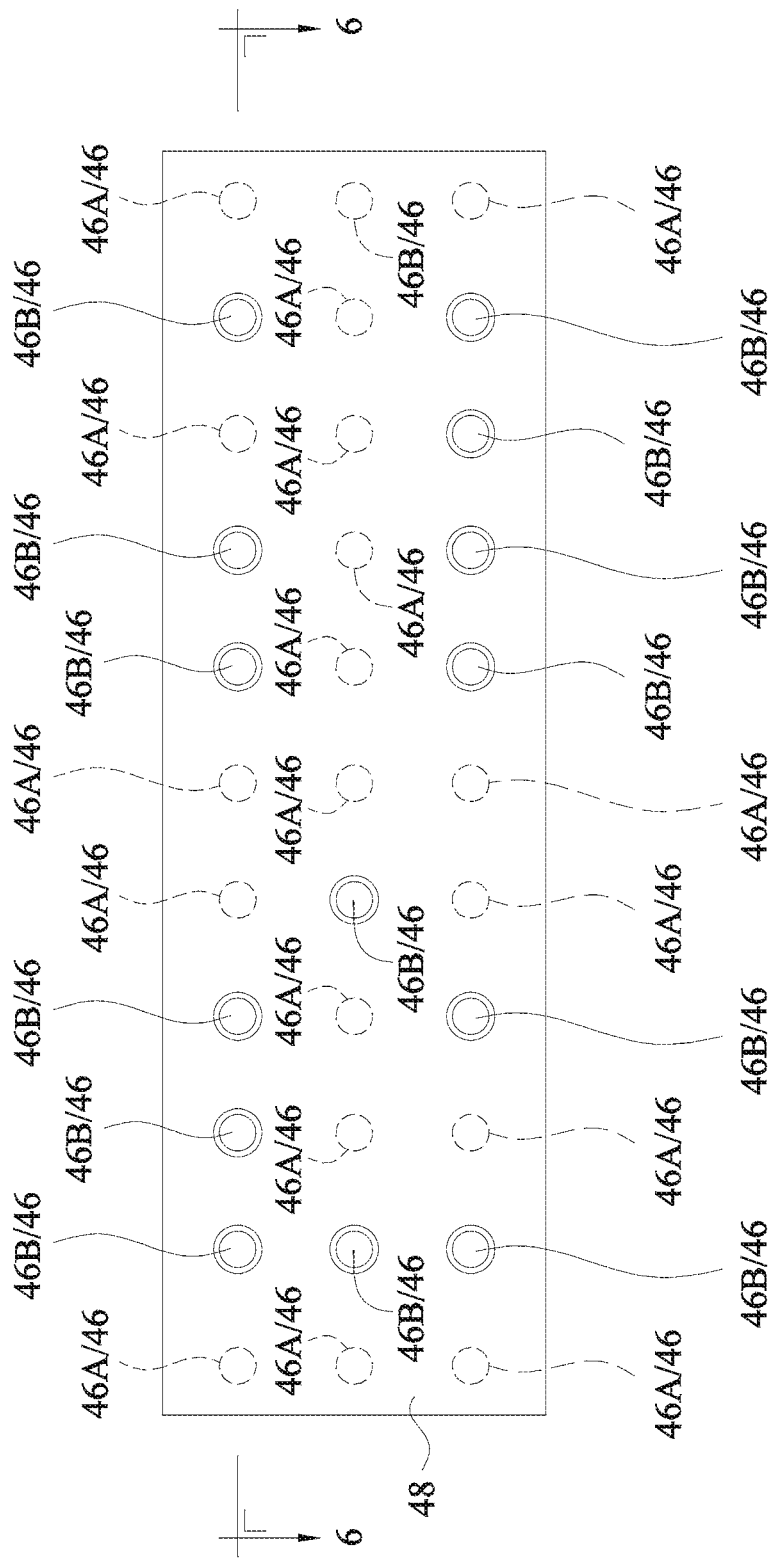

FIG. 7 illustrates a top view of the structure in FIG. 6. The cross-sectional view in FIG. 6 is obtained from the plane crossing line 6-6 in FIG. 7. As shown in FIG. 7, ground mesh 48 forms a large metal foil. In some embodiments, all the portions of ground mesh 48 are connected into a single integrated piece, although they may form a plurality of pieces. UBMs 46A, which are integrated portions of metal mesh 48, connect metal mesh 48 to the underlying TAVs 28 and metal bumps 26 (FIG. 6). UBMs 46B are separated from ground mesh 48 by spaces. The total top-view area of ground mesh 48 may be greater than about 50 percent the total top-view area of composite wafer 100. In some embodiments, each of the UBMs 46B is spaced apart from the rest of the UBMs 46B by ground mesh 48. Furthermore, in some exemplary embodiments, no two UBMs 46B are next to each other without a portion of ground mesh 48 inserted in between, although several UBMs 46 may be close to each other with no ground mesh 48 inserted in between in alternative embodiments.

Figure 8:
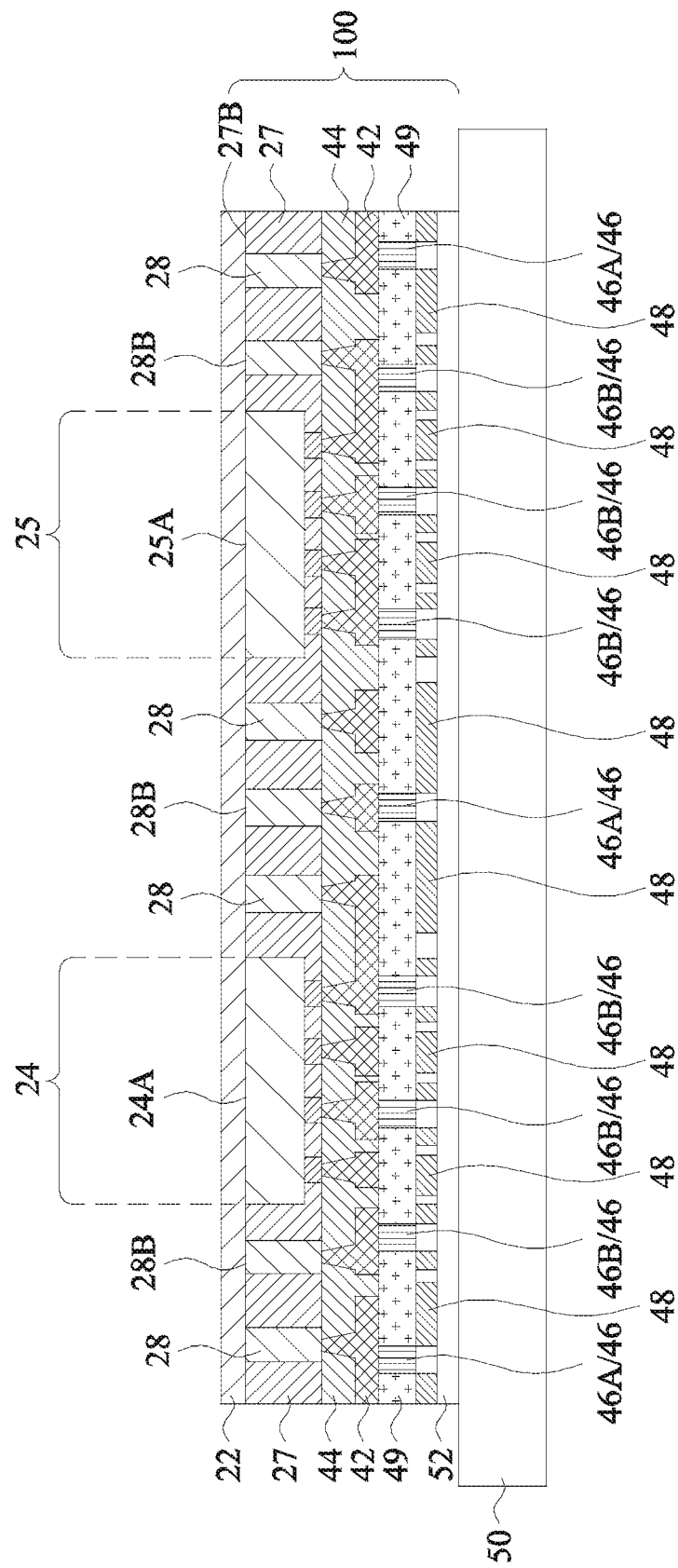

A carrier switch is performed. In the carrier switch process, carrier 50, as shown in FIG. 8, is first attached to composite wafer 100, wherein carriers 50 and carrier 20 (FIG. 6) are on opposite sides of composite wafer 100. Carrier 50 may be attached to composite wafer 100 through adhesive 52, which may be an UV glue, a tape, or the like. Carrier 20 is then detached from composite wafer 100.

After the carrier switch, metal foil 22 is exposed. In the illustrated structure, back ends 28B of TAVs 28 are level with back surface 24A of device die 24 and back surface 25A of device die 25. Back ends 28B of TAVs 28 may also be substantially level with surface 27B of molding material 27. Furthermore, TAVs 28 are connected to the bottom surface of metal foil 22.

Figure 9:
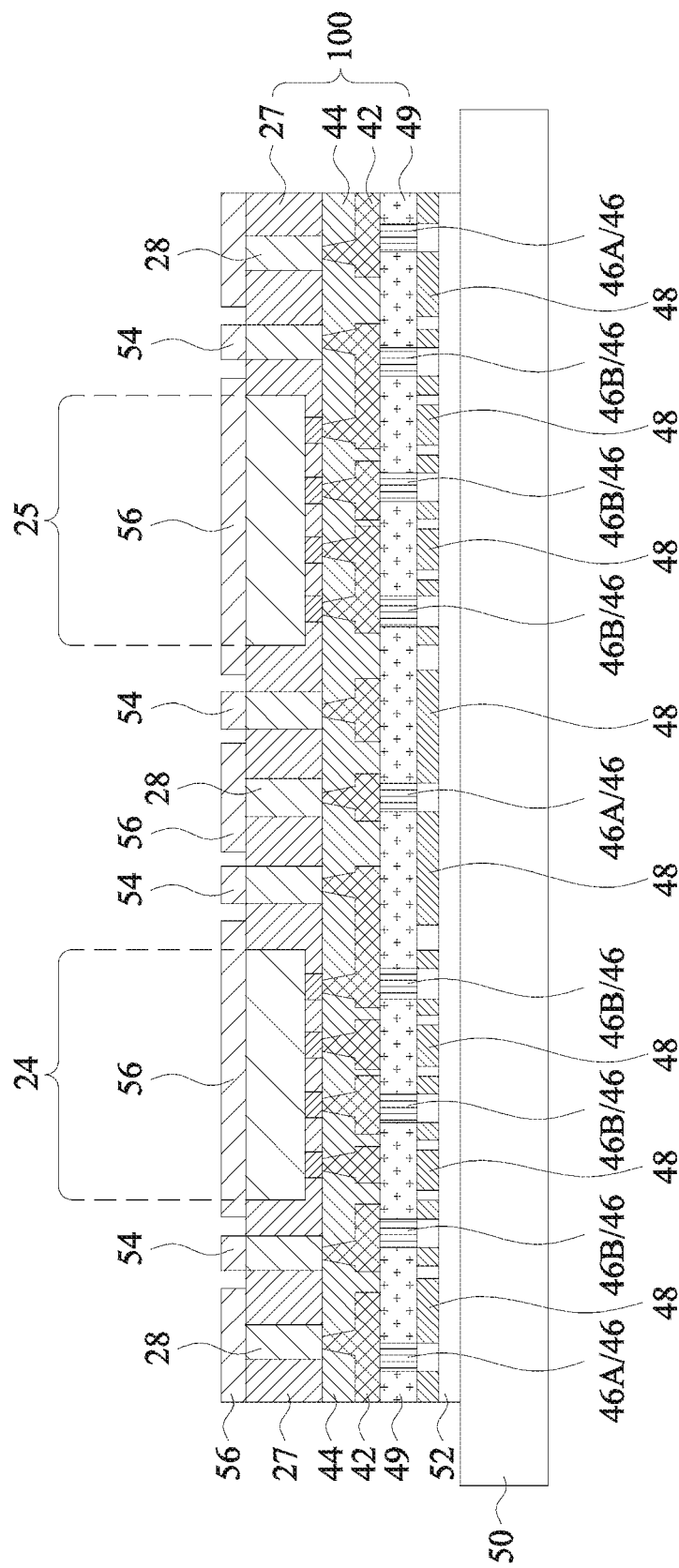

Next, as shown in FIG. 9, an etching process is performed to pattern metal foil 22. Hence, metal foil 22, being patterned, form metal pads 54 and metal mesh 56, which are physically separated from each other and may be electrically disconnected from each other. TAVs 28 include first portions underlying and connected to metal mesh 56, and second portions underlying and connected to metal pads 54.

Figure 10A:
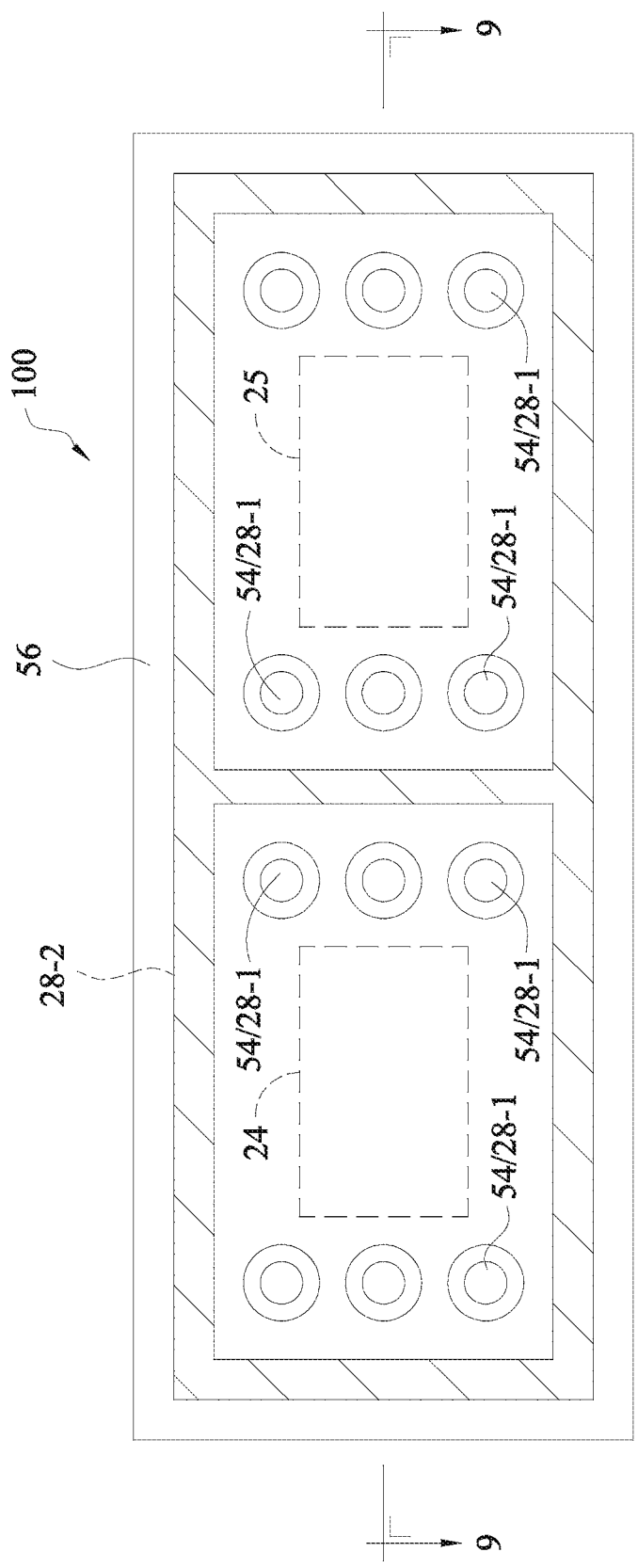

FIG. 10A illustrates a top view of metal pads 54 and metal mesh 56. The cross-sectional view in FIG. 9 may be obtained from the plane crossing line 9-9 in FIG. 10. As shown in FIG. 10A, metal mesh 56 is connected to the underlying TAVs 28-2, and metal pads 54 are connected to the underlying TAVs 28-1. Metal pads 54 are physically separated and are electrically disconnected from ground mesh 48 by spaces. As shown in FIG. 9, metal mesh 56 is over and in physical contact with the back surface of dies 24 and 25. Hence, metal mesh 56 has the function of dissipating the heat generated in dies 24 and 25. FIG. 10A also illustrates that some discrete TAVs (marked as 28-1) have the shape of metal posts. TAVs 28 may also include some TAVs 28-2 that form full rings encircling dies 24 and 25.

Figure 10B:
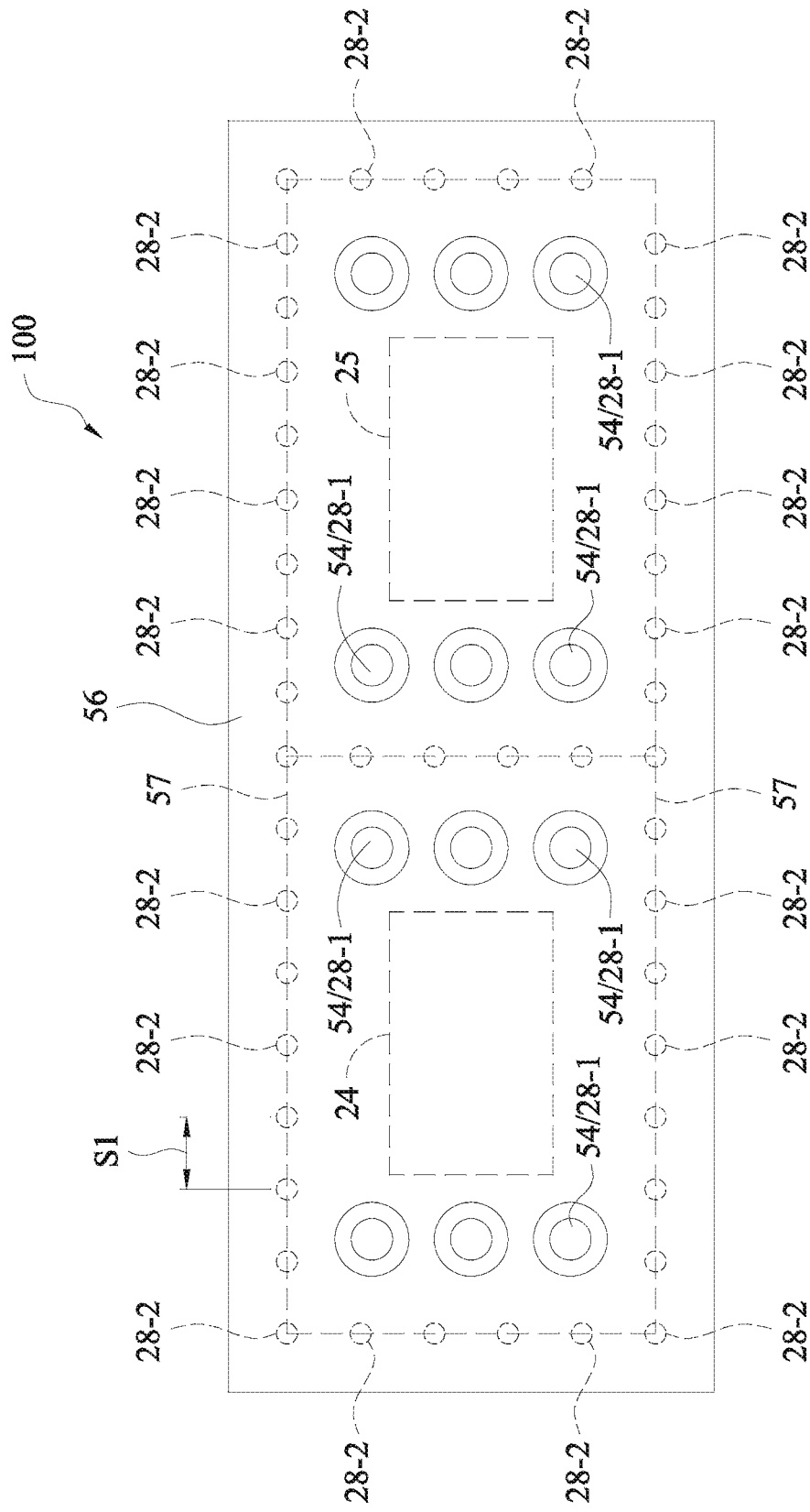

FIG. 10B illustrates a top view of composite wafer 100 in accordance with alternative embodiments, wherein TAVs 28-2, instead of forming full ring, are discrete metal posts that aligned to ring 57, which ring encircles die 24 or 25. Spacing 51 between discrete TAVs 28-2 is small enough for shielding signals. For example, spacing 51 may be smaller than about one fourth of the wave length of the signal to be isolated, which signal may be carried by dies 24 and 25.

In some exemplary embodiments, the total top-view area of metal mesh 56 is greater than about 50 percent the total top-view area of composite wafer 100. Furthermore, each of metal pads 54 may be spaced apart from the rest of the metal pads 54 by metal mesh 56. In some embodiments, no two metal pads 54 are next to each other without a portion of metal mesh 56 inserted in between, although several metal pads 54 may be close to each other with no ground mesh 48 inserted in between.

Figure 11:
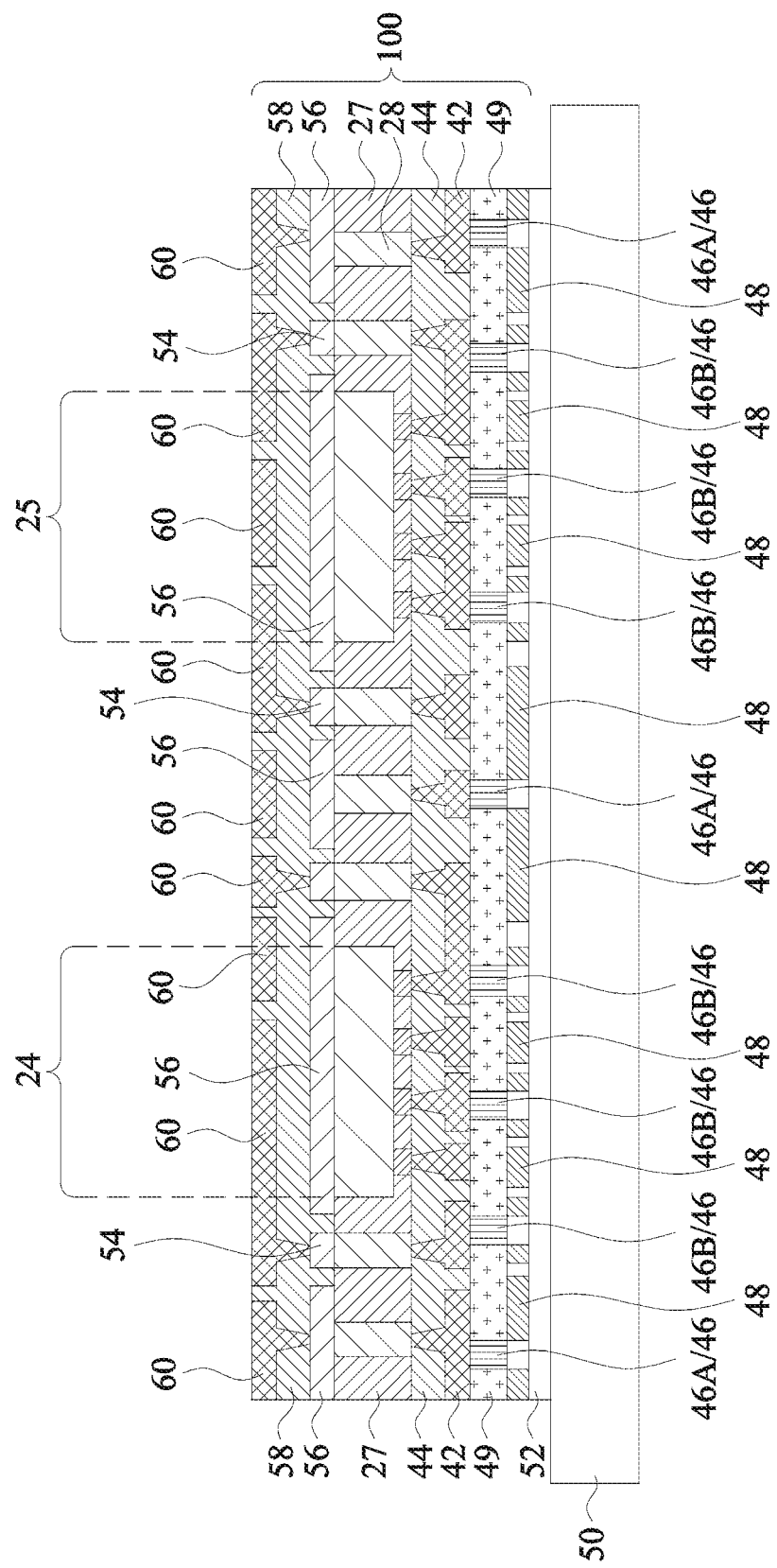

Next, as shown in FIG. 11, dielectric layers 58 and RDLs 60 are formed. In some embodiments, dielectric layers 58 are formed of dielectric materials such as oxides, nitrides, carbides, carbon nitrides, combinations thereof, and/or multi-layers thereof. RDLs 60 are formed in dielectric layer 58 and connected to metal pads 54 and metal mesh 56. Some of RDLs 60 may extend over and aligned to device dies 24 and 25, and some other RDLs 60 may extend beyond the boundaries of dies 24 and 25. Accordingly, RDLs 60 have a fan-out structure.

Figure 12:
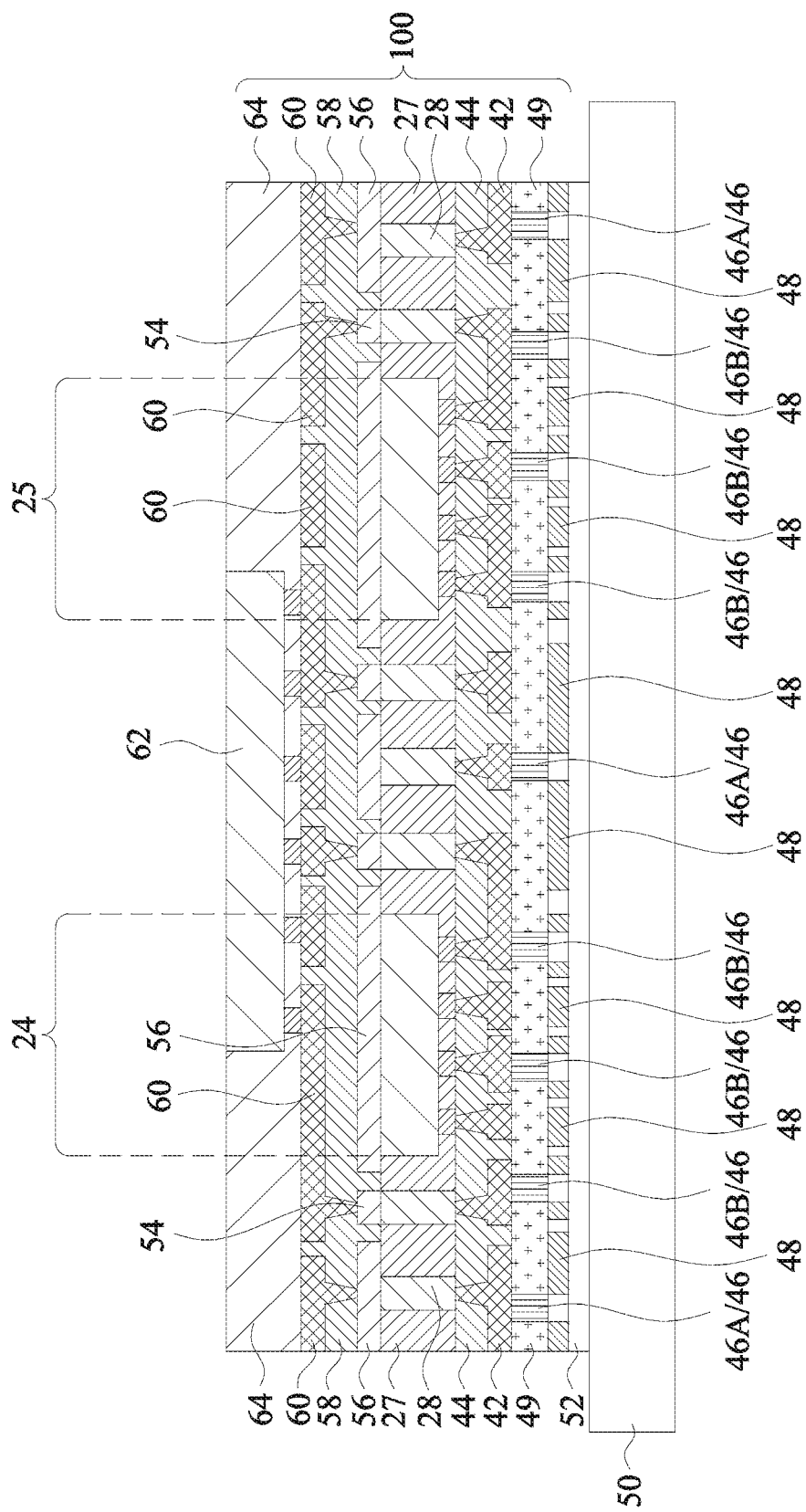
Figure 13:
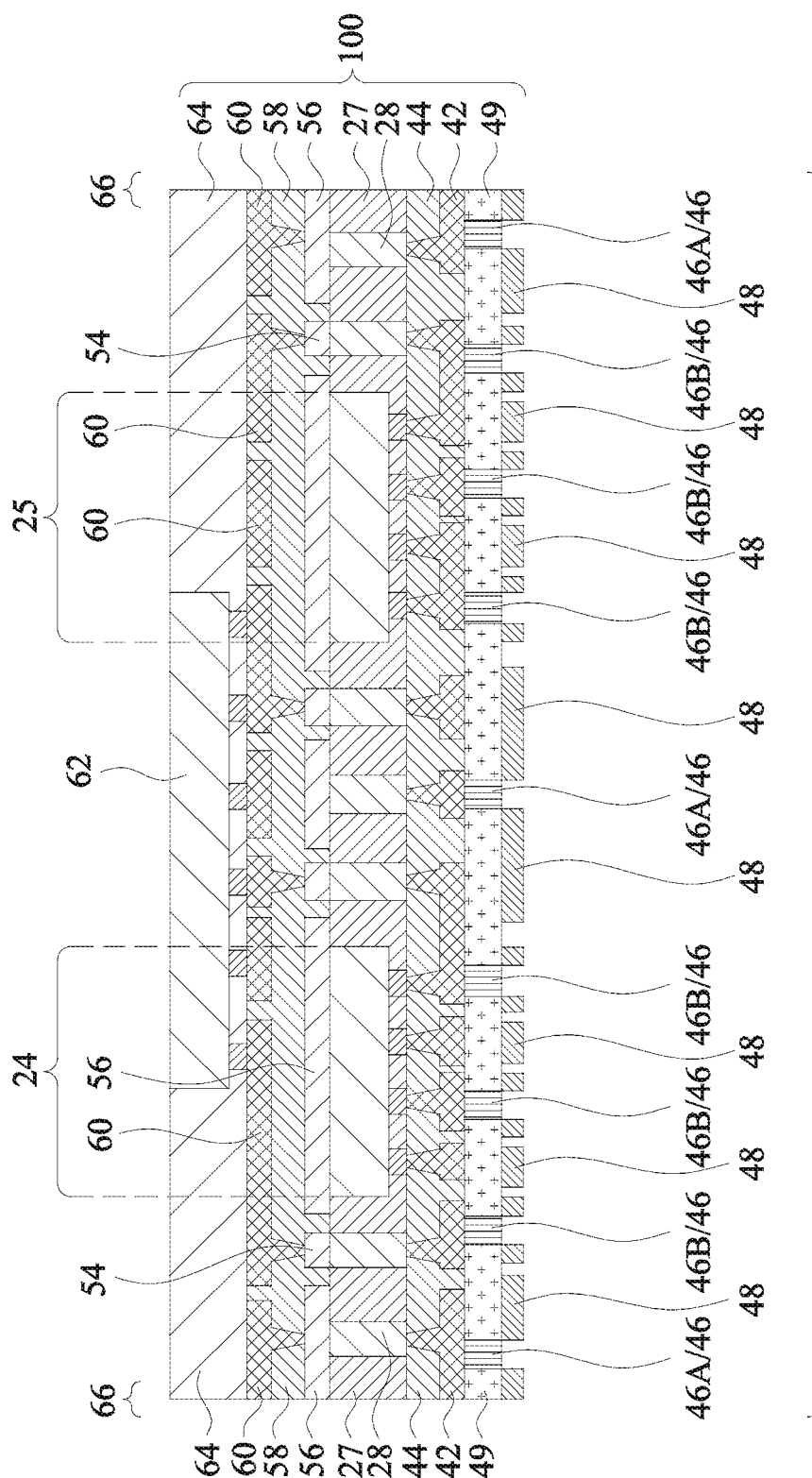

FIG. 12 illustrates the bonding of die 62 to RDLs 60, which bonding may be performed through, for example, solder bonding, metal-to-metal direct bonding, or the like. Molding material 64 is used to mold die 62, RDL 60, and dielectric layers 58. In some embodiments, after the molding process, a planarization is performed, so that the back surface of die 62 is exposed. After the planarization, carrier 50 may be detached from composite wafer 100. The resulting structure is shown in FIG. 13. A die saw is then performed on composite wafer 100 along scribe lines 66. Composite wafer 100 is thus separated into a plurality of packages 110 identical to each other.

Figure 14:
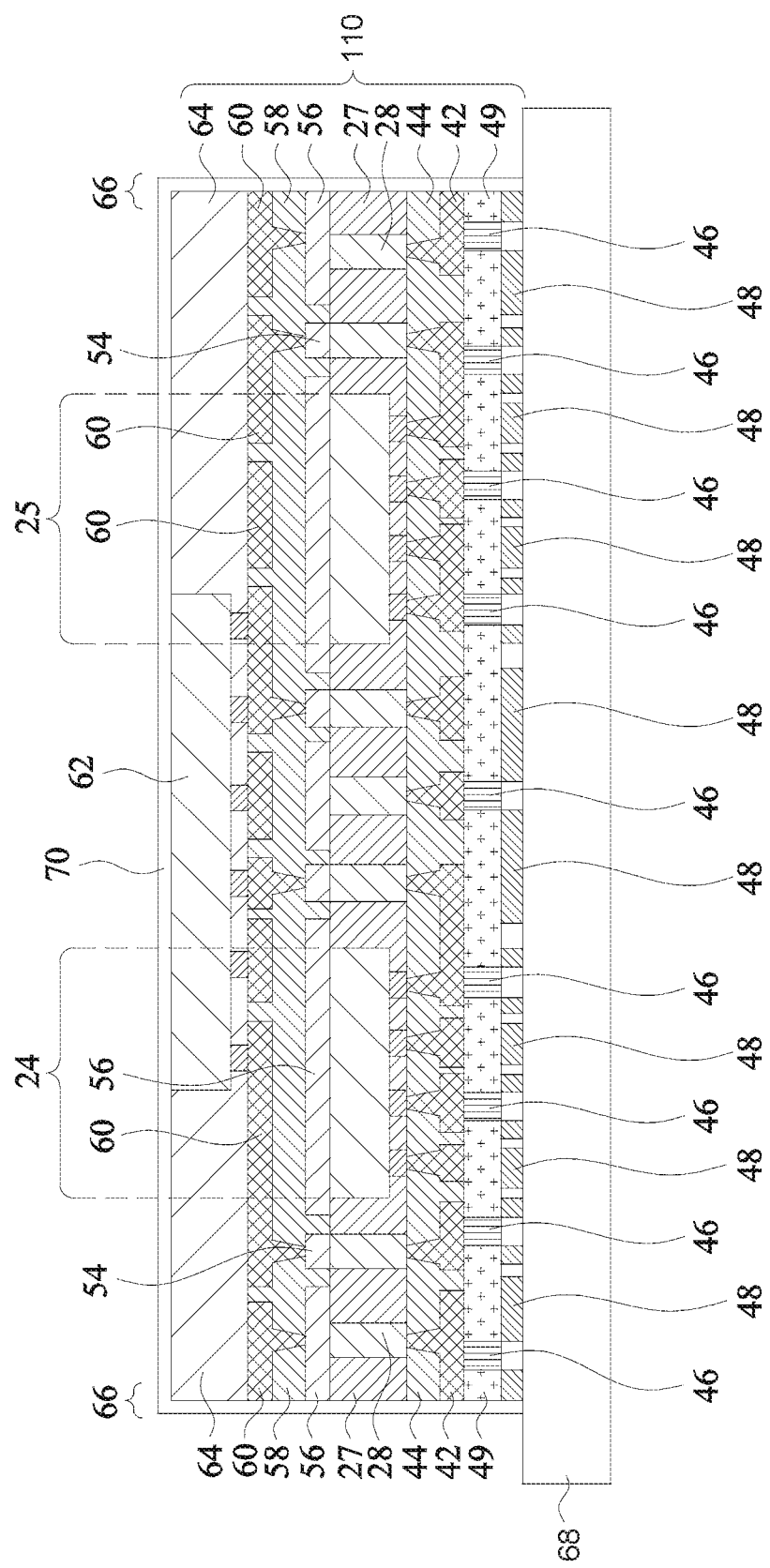

Referring to FIG. 14, package 110 is mounted on carrier 68. Metal shielding film 70 is then formed on the outer surfaces of package 110. In some embodiments, metal shielding film 70 comprises copper, although other metallic materials may be used. Metal shielding film 70 may be formed by Physical Vapor Deposition (PVD), metal spray, plating, or combinations thereof. In the embodiments in which the metal spray is used, a metal-containing spray (a liquid or a gel) such as copper spray is sprayed on the top surface and sidewall surfaces of package 110. The metal spray is then cured, and the remaining substance comprises metal particles (such as copper particles) and some adhesive materials that glue the metal particles together. The resulting cured metal spray is electrical conductive. The metal spray is distinguishable from the pre-formed metal shielding cases that are formed of stamping processes. For example, since metal shielding film 70 is formed by deposition rather than being a stamping process, there is no gap (air space) between metal shielding film 70 and the portion of package 110 enclosed by metal shielding film 70. Furthermore, metal shielding film 70 may include an adhesive material to glue the metal particles together.

The bottom surface of package 110 has no metal shielding film 70 formed thereon, and hence UBMs 46 and ground mesh 48 remain separated from each other. Furthermore, metal shielding film 70 is joined to the edges of ground mesh 48 and metal mesh 56 to form integrated shielding cases. After the formation of metal shielding film 70, package 110 is separated from carrier 68.

Figure 15:
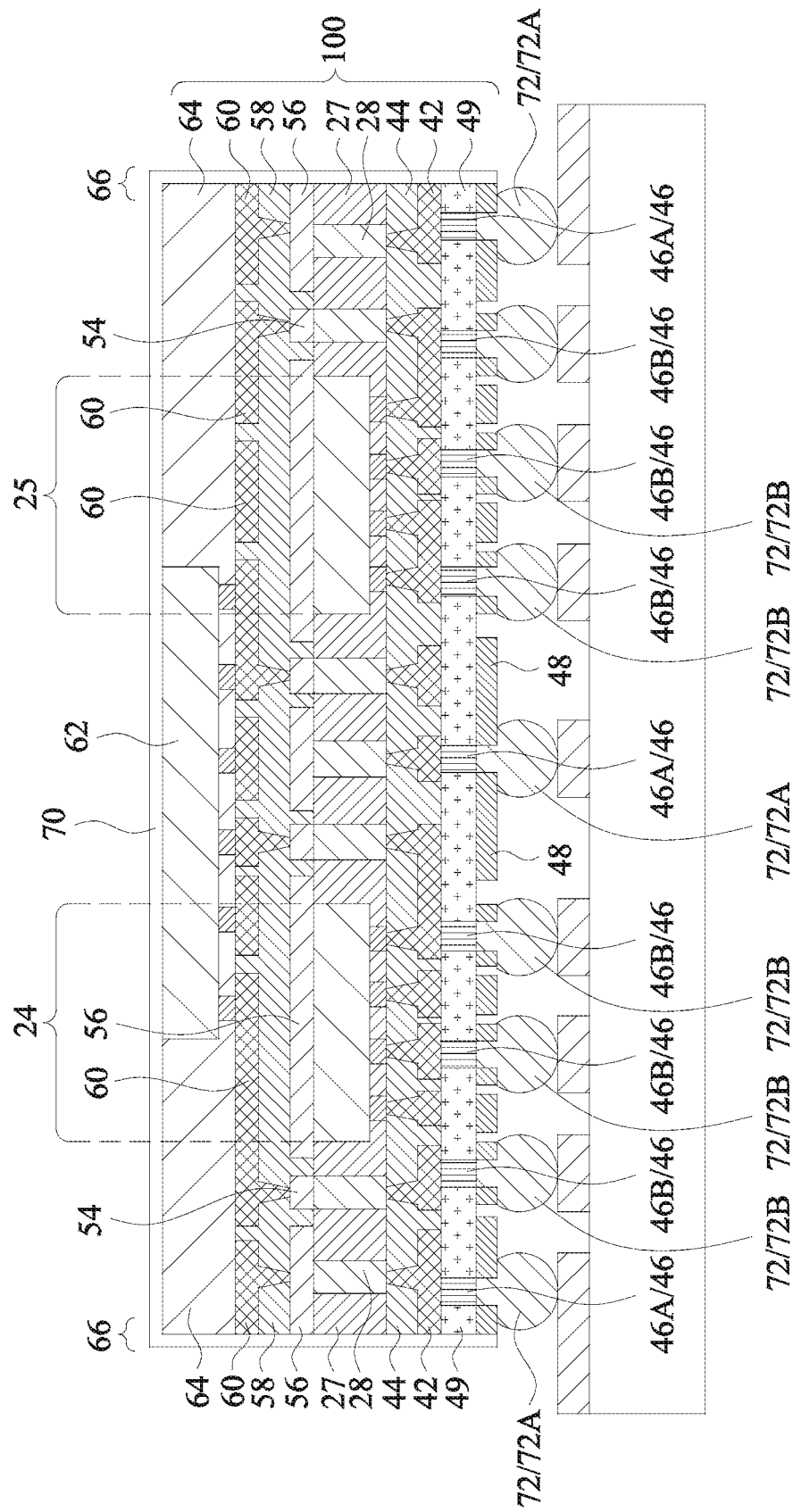

FIG. 15 illustrates the formation of electrical connectors 72 in accordance with some exemplary embodiments. The formation of connectors 72 may include placing solder balls on the exposed portions of UBMs 46A and 46B, and then reflowing the solder balls. In alternative embodiments, the formation of connectors 72 includes performing a plating step to form solder regions on UBMs 46A and 46B, and then reflowing the solder regions. The resulting package 110 may then be bonded to another package component 74, which may be an interposer, a package substrate, a PCB, or the like. Connectors 72 include grounding connectors 72A that connect the electrical ground of package 110 to the ground of package component 74, and connectors 72B that connect the signal lines of package 110 to the signal lines of package component 74.

Figure 16:
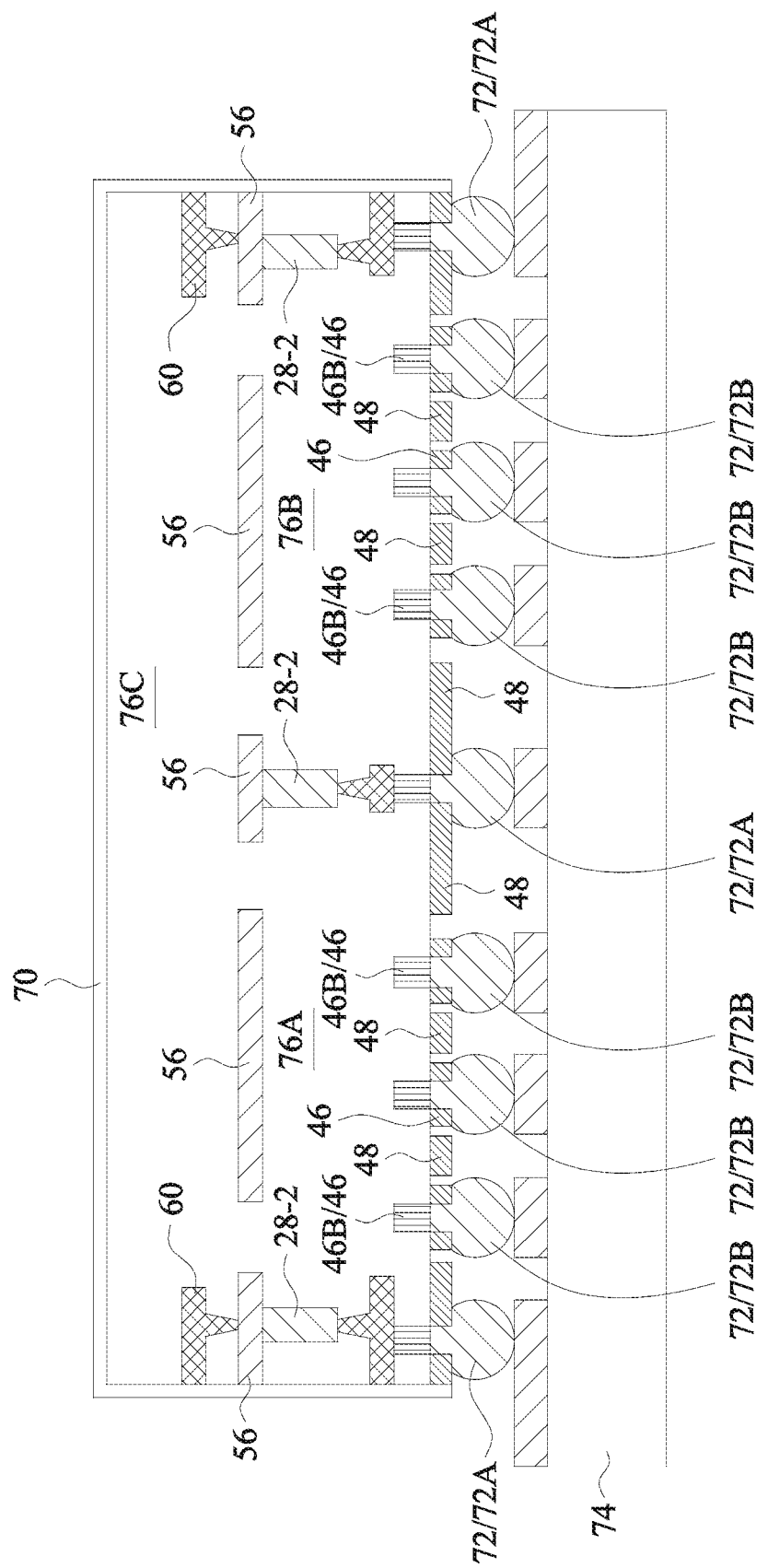
FIG. 16 illustrates an abstract view of the package in accordance with some embodiments, wherein the metal connections in the package are illustrated.

FIG. 16 illustrates an abstract view of the structure in FIG. 15. The structure is simplified, and the RDLs, some TAVs, and dies are not illustrated. As shown in FIG. 16, metal shielding film 70, TSVs 28-2 (which may form circles), metal mesh 56, and ground mesh 48 in combination form metal shielding cases that enclose metal shielding caves 76A, 76B, and 76C therein. Each of metal shielding caves 76A, 76B, and 76C is enclosed by one of the metal shielding cases, which are formed of metal features that may shield electro-magnetic field. The metal shielding structure is a 3D structure. The metal shielding cases are substantially fully enclosed, except that some gaps are left for the routing of signal in and out of the metal shielding cases.

FIGS. 17 through 30 illustrate the cross-sectional views, perspective views, and top views of a package and the intermediate stages in the formation of the package in accordance with alternative embodiments. Unless specified otherwise, the materials and the formation methods of the components in these embodiments are similar to the materials and the formation methods of like components, which are denoted by like reference numerals in the embodiments shown in FIGS. 1 through 16. The details regarding the formation process and the materials of the components shown in FIGS. 17 through 30 may thus be found in the discussion of the embodiments shown in FIGS. 1 through 16.

Figure 17:
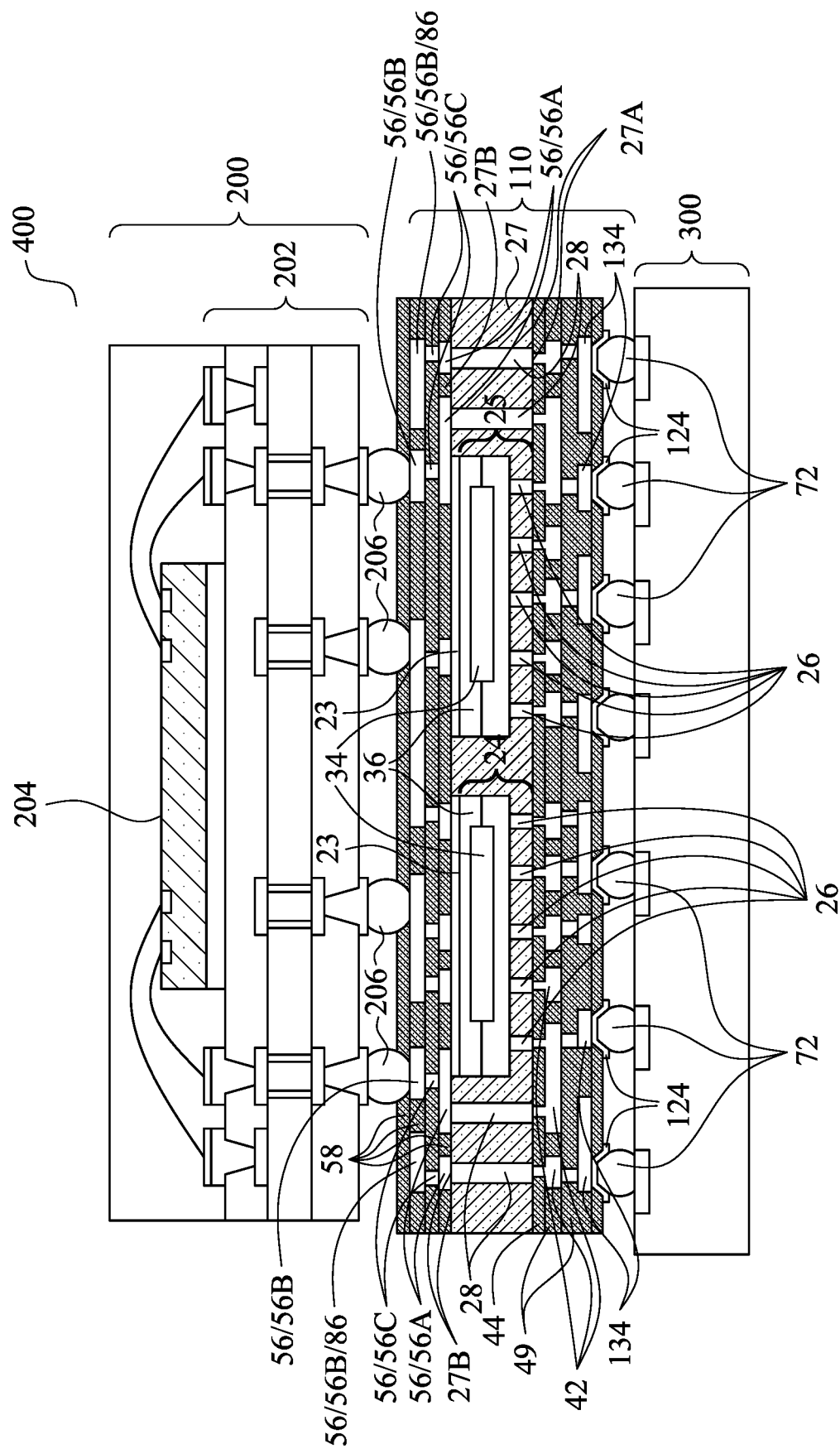
FIGS. 17 through 30 are cross-sectional views and top views of intermediate stages in the formation of a package in accordance with alternative embodiments.

FIG. 17 illustrates a cross-sectional view of package 400 in accordance with some embodiments. Package 400 includes package 110 and package 200 on top of and bonded to package 110. In some embodiments, package 110 includes device dies 24 and 25, with the front sides of device dies 24 and 25 facing down and bonded to Redistribution Lines (RDLs) 42 and 134. In alternative embodiments, package 110 includes a single device die or more than two device dies. Device die 24/25 may include semiconductor substrates 36 and integrated circuit devices 34 such as active devices, which may include transistors, for example, on the front surface (the surface facing down) of the respective semiconductor substrates 36. Device die 24/25 may include a logic die such as a Central Processing Unit (CPU) die, a Graphic Processing Unit (GPU) die, a mobile application die, or the like.

Device dies 24 and 25 are molded in molding material 27, which surrounds each of device dies 24 and 25. Molding material 27 may be a molding compound, a molding underfill, a resin, or the like. Surface 27A of molding material 27 may be level with the bottom ends of device dies 24 and 25. Surface 27B of molding material 27 may be level with or higher than the back surface of the semiconductor substrates 36 in device die 24/25. In some embodiments, the back surfaces of the semiconductor substrates 36 of device dies 24/25 are in contact with die-attach film 23, which is a dielectric film adhering the respective device die 24/25 to the overlying dielectric layer 58. Device dies 24 and 25 further include metal pillars/pads 26 (which may include copper pillars, for example) electrically coupled to RDLs 42.

Package 110 may include bottom-side RDLs 42 and 134 underlying device dies 24 and 25 as well as top-side RDLs 56 overlying device dies 24 and 25. Bottom-side RDLs 42 and 134 are formed in dielectric layers 44 and 49, and top-side RDLs 56 are formed in dielectric layers 58. RDLs 42, 134, and 56 may be formed of copper, aluminum, nickel, titanium, alloys thereof, or multi-layers thereof. In some embodiments, dielectric layers 44, 49, and 58 are formed of organic materials such as polymers, which may further include polybenzoxazole (PBO), benzocyclobutene (BCB), polyimide, or the like. In alternative embodiments, dielectric layers 44, 49, and 58 are formed of inorganic materials such as silicon oxide, silicon nitride, silicon oxynitride, or the like.

TAVs 28 are formed in, and may substantially penetrate through, molding material 27. In some embodiments, the first surfaces of TAVs 28 (the top surfaces in FIG. 17) are level with the surface 27B of molding material 27, with the second surfaces (the bottom surfaces in FIG. 17) substantially level with the surface 27A of molding material 27. TAVs 28 electrically couple bottom-side RDLs 42 and 134 to top-side RDLs 56. TAVs 28 may also be in physical contact with top-side RDLs 56 and/or the vias in RDLs 42.

UBMs 124, which are formed of a non-solder metallic material(s), are formed close to the bottom surface of package 110. UBMs 124 may include copper, aluminum, titanium, nickel, palladium, gold, or multi-layers thereof. In some embodiments, the bottom surfaces of UBMs 124 extend below the bottom surface of the bottom dielectric layer 49, as shown in FIG. 17. Solder regions 72 may be attached to the bottom surfaces of UBMs 124.

Package 110 is bonded to package components 200 and 300. In accordance with some embodiments, package component 300 is a Printed Circuit Board (PCB). Package component 200 may be a package including memory dies (such as Static Random Access Memory (SRAM) dies or Dynamic Random Access Memory (DRAM) dies) 204 therein. Furthermore, package component 200 may include package substrate 202, on which die 204 is bonded.

Figure 18:
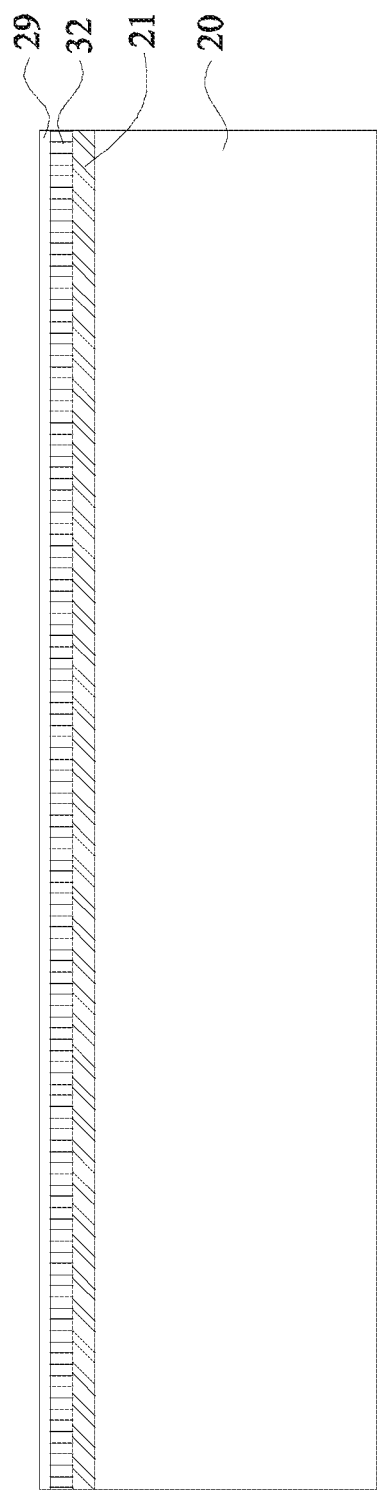

FIGS. 18 through 30 illustrate the cross-sectional views of intermediate stages in the formation of package 110 in accordance with some exemplary embodiments. Referring to FIG. 18, carrier 20 is provided, and adhesive layer 21 is disposed on carrier 20. Carrier 20 may be a blank glass carrier, a blank ceramic carrier, or the like. Adhesive layer 21 may be formed of an adhesive such as an Ultra-Violet (UV) glue, a Light-to-Heat Conversion (LTHC) glue, or the like, although other types of adhesives may be used. In some embodiments, adhesive layer 21 has the function of being decomposed under the heat of light and hence releasing carrier 20 from the structure formed thereon.

Buffer layer 32 is formed over adhesive layer 21. In accordance with some embodiments of the present disclosure, buffer layer 32 is a dielectric layer, which may be a polymer layer. The polymer may be, for example, polyimide, PBO, BCB, Ajinomoto Buildup Film (ABF), Solder Resist film (SR), or the like. Buffer layer 32 is a planar layer with a uniform thickness, which may be greater than about 2 μm and may be between about 2 μm and about 40 μm. The top and the bottom surfaces of buffer layer 32 are also planar. In alternative embodiments, buffer layer 32 is not formed.

Seed layer 29 is formed over buffer layer 32, for example, through Physical Vapor Deposition (PVD) or metal foil lamination. Seed layer 29 may comprise copper, aluminum, titanium, or multi-layers thereof. In some embodiments, seed layer 29 comprises a titanium layer (not shown) and a copper layer (not shown) over the titanium layer. In alternative embodiments, seed layer 29 is a single copper layer.

Figure 19:
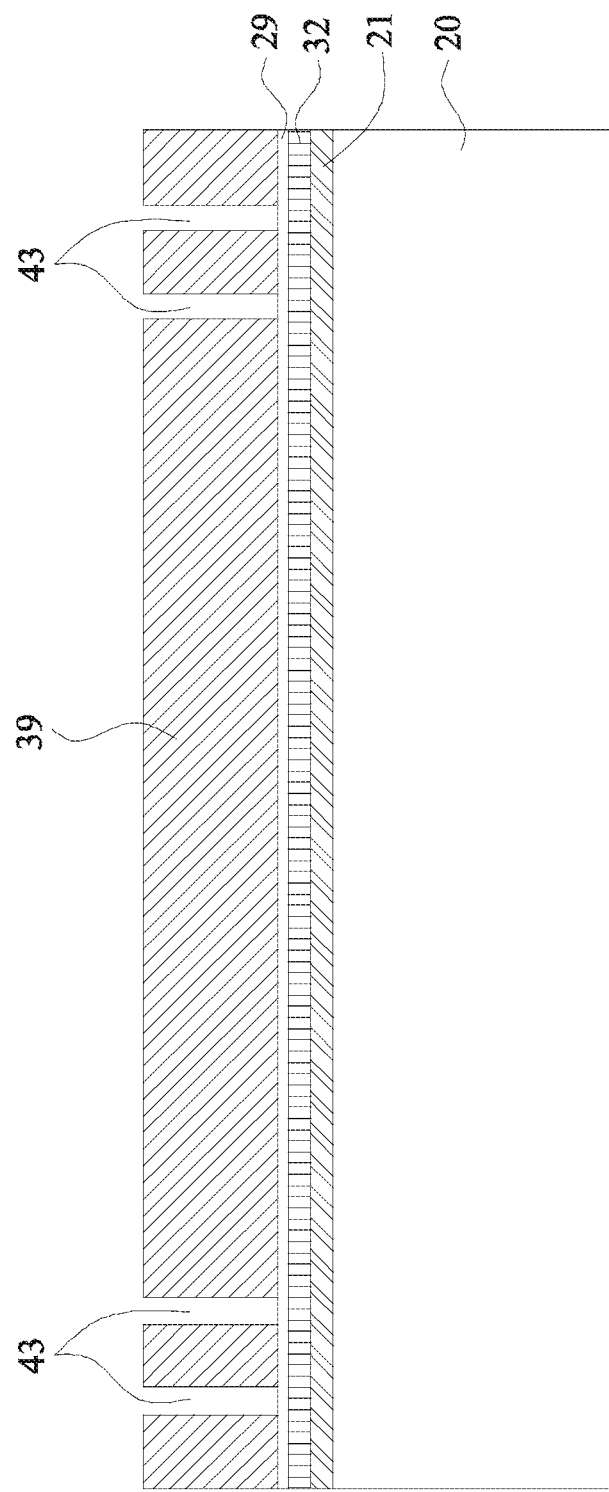

Referring to FIG. 19, photo resist 39 is applied over seed layer 29 and is then patterned. As a result, openings 43 are formed in photo resist 39, through which some portions of seed layer 29 are exposed.

Figure 20:
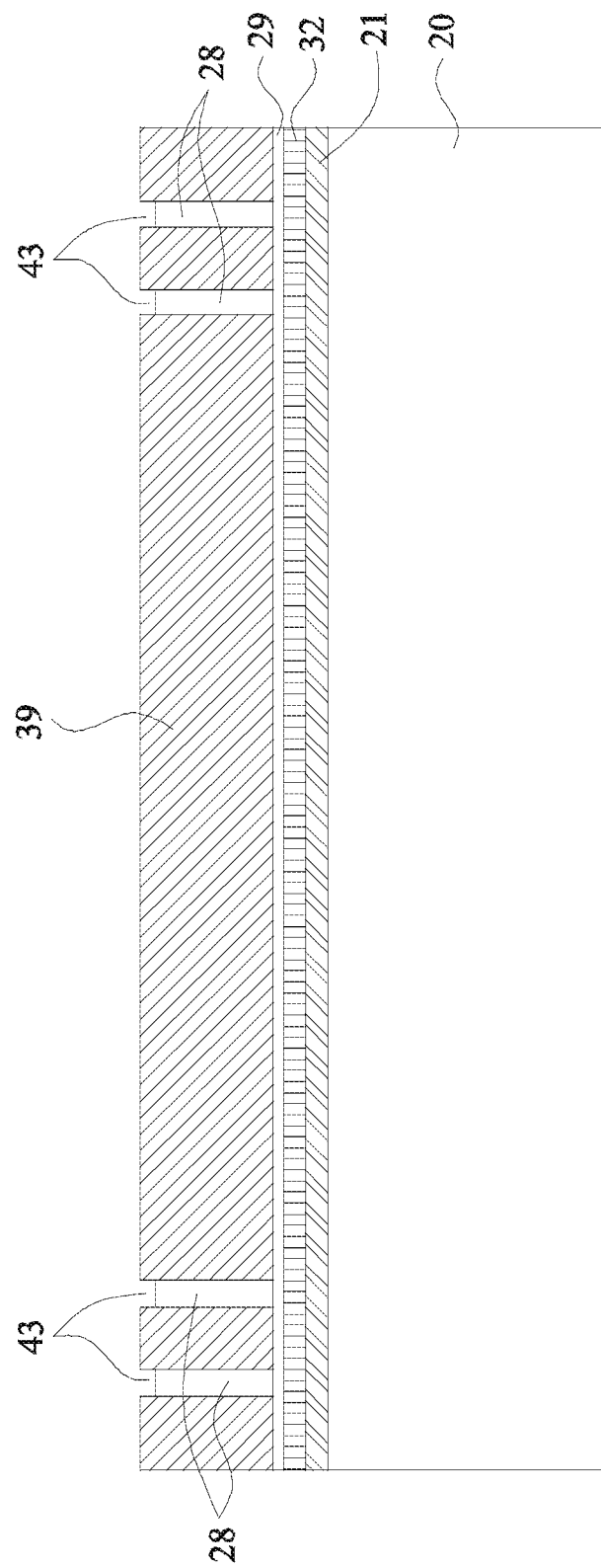

As shown in FIG. 20, TAVs 28 are formed in photo resist 39 through plating, which may be electro plating or electro-less plating. TAVs 28 are plated on the exposed portions of seed layer 29. TAVs 28 may include copper, aluminum, tungsten, nickel, or alloys thereof. The top-view shapes of TAVs 28 may be rectangles, squares, circles, or the like. The heights of TAVs 28 are determined by the thickness of the subsequently placed dies 24 and 25 (FIG. 17), with the heights of TAVs 28 greater than or equal to the thicknesses of dies 24 and 25 in various embodiments.

Figure 21:
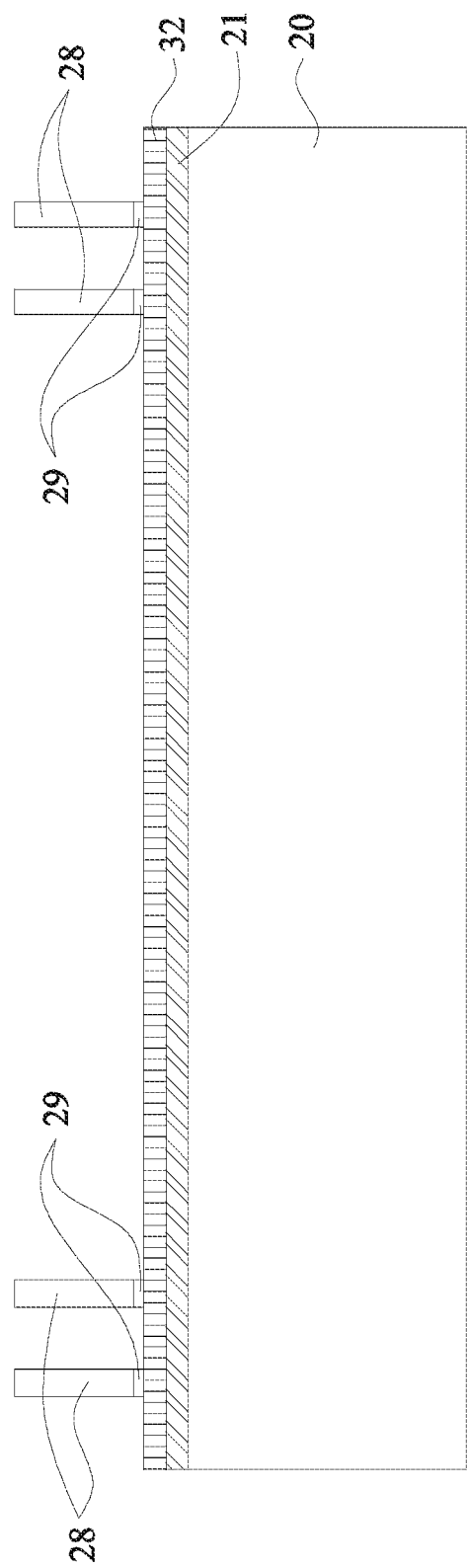

After the plating of TAVs 28, photo resist 39 is removed, and the resulting structure is shown in FIG. 21. In addition, the portions of seed layer 29 (FIG. 20) that are covered by photo resist 39 are exposed. An etch step is then performed to remove the exposed portions of seed layer 29, wherein the etching may be an anisotropic etching. The portions of seed layer 29 that are overlapped by TAVs 28, on the other hand, remain not etched. Throughout the description, the remaining underlying portions of seed layer 29 are referred to as the bottom portions of TAVs 28. Although seed layer 29 is shown as having distinguishable interfaces with the overlying portions of TAVs 28, when seed layer 29 is formed of a material similar to or the same as the respective overlying TAVs 28, seed layer 29 may be merged with TAVs 28 with no distinguishable interface therebetween. In alternative embodiments, there exist distinguishable interfaces between seed layer 29 and the overlying plated portions of TAVs 28.

Figure 22:
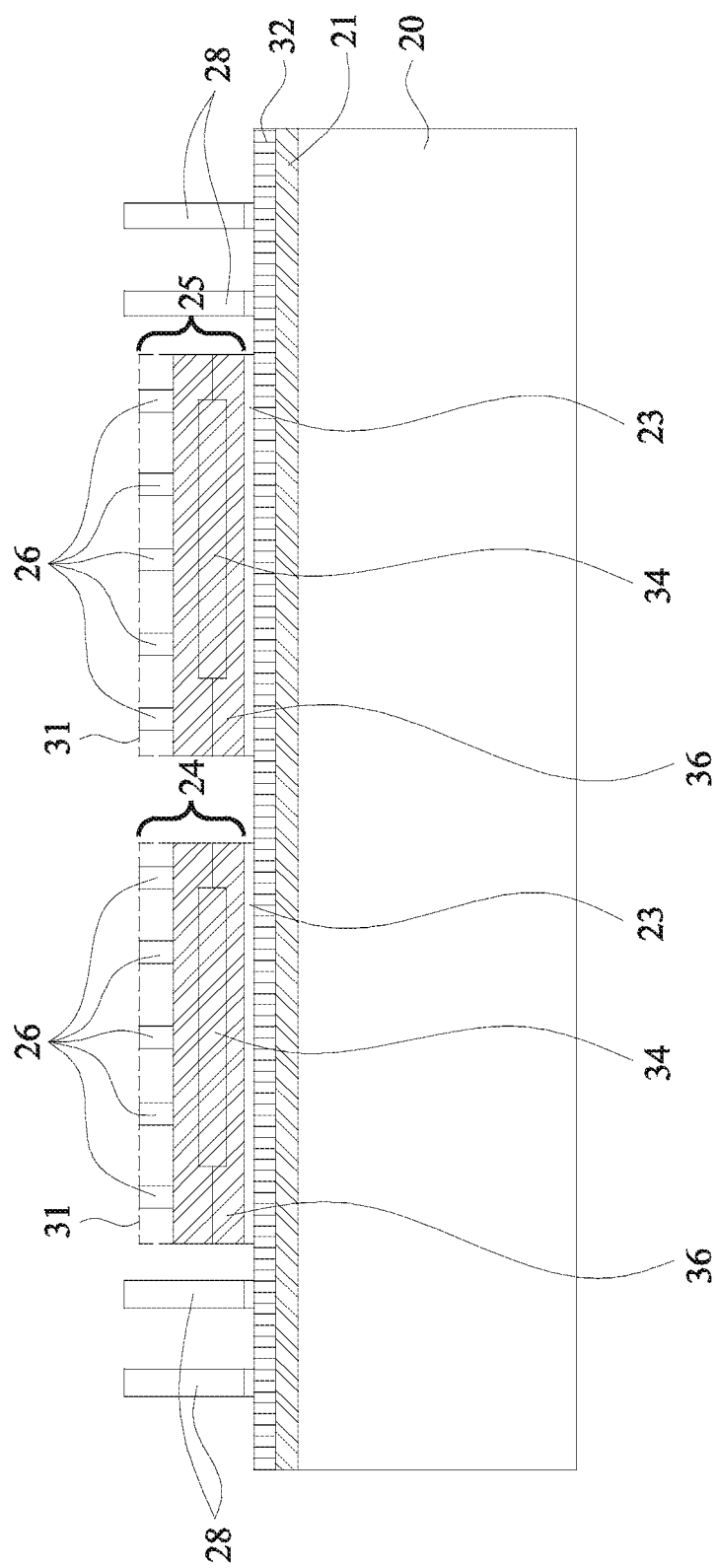

FIG. 22 illustrates the placement of device dies 24 and 25 over buffer layer 32. Device dies 24 and 25 may be adhered to buffer layer 32 through Die-Attach Films (DAFs) 23. Device dies 24 and 25 may be logic device dies including logic transistors 34 therein. The semiconductor substrates 36 (silicon substrates, for example) of device dies 24 and 25 are in contact DAFs 23, wherein the back surfaces of semiconductor substrates 36 are in contact with DAFs.

In some exemplary embodiments, metal pillars 26 (such as copper posts) are formed as the top portions of device dies 24 and 25 and are electrically coupled to the devices such as transistors (not shown) in device dies 24 and 25. In some embodiments, dielectric layer 31 is formed at the top surface of the respective device die 24/25, with at least the lower portions of metal pillars 26, or their entirety, within dielectric layer 31. The top surfaces of metal pillars 26 may also be level with the top surfaces of dielectric layers 31 in some embodiments. Alternatively, dielectric layers 31 are not formed, and metal pillars 26 protrude above a top dielectric layer of the respective device dies 24 and 25.

Figure 23:
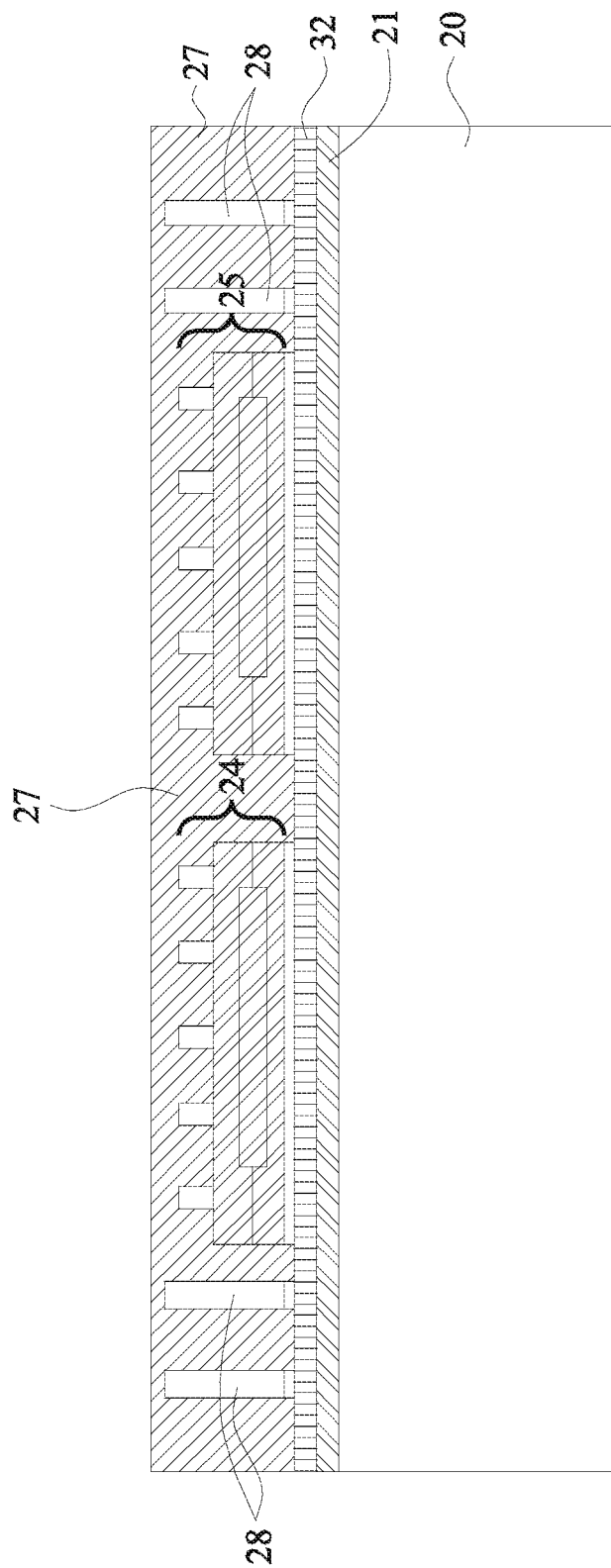

Referring to FIG. 23, molding material 27 is molded on device dies 24 and 25 and TAVs 28. Molding material 27 fills the gaps between device dies 24, 25, and TAVs 28 and may be in contact with buffer layer 32. Furthermore, molding material 27 is filled into the gaps between metal pillars 26 when metal pillars 26 are protruding metal pillars. Molding material 27 may include a molding compound, a molding underfill, an epoxy, or a resin. After the molding process, the top surface of molding material 27 is higher than the top ends of metal pillars 26 and TAVs 28.

Figure 24:
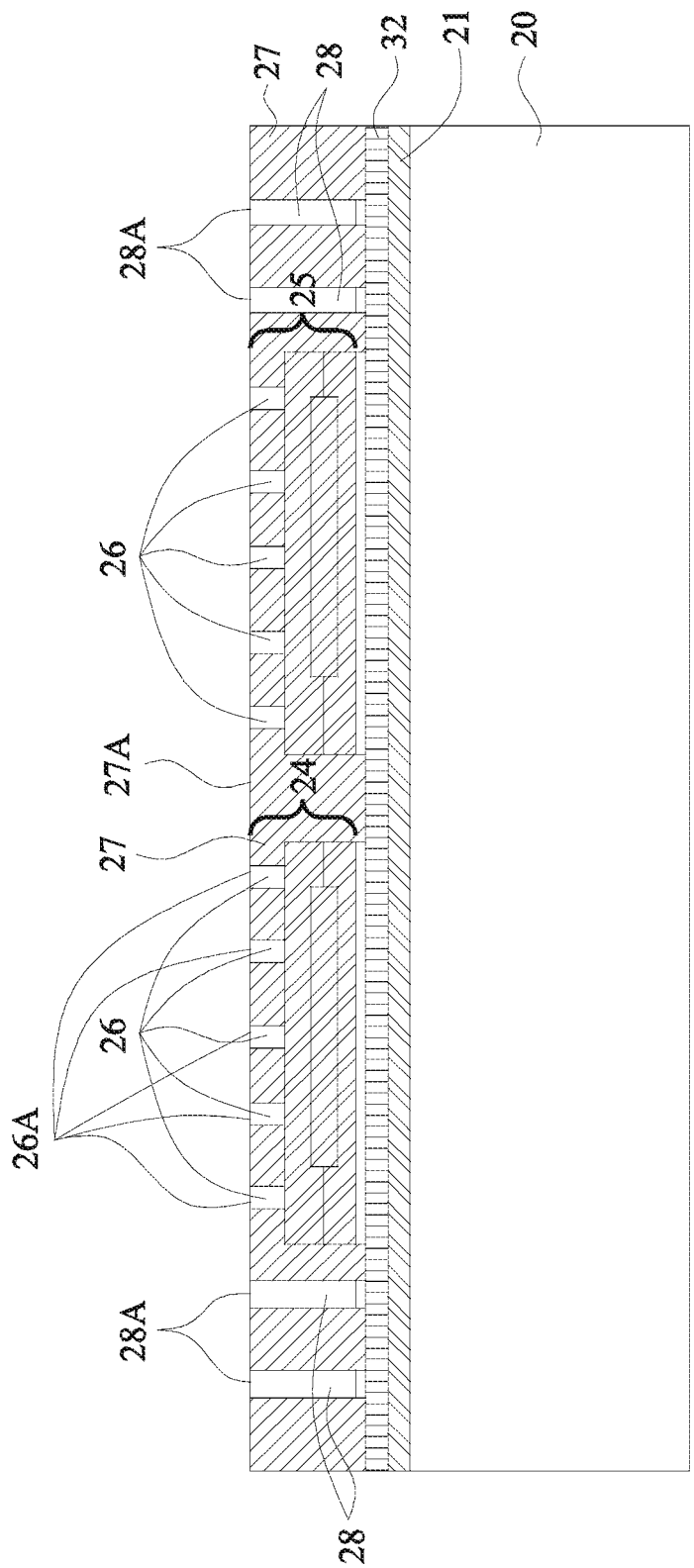

Next, a planarization step such as a Chemical Mechanical Polish (CMP) step or a grinding step is performed to thin molding material 27 until TAVs 28 are exposed. In some embodiments, as shown in FIG. 24, metal pillars 26 are also exposed as a result of the grinding. Due to the grinding, the top surfaces 28A of TAVs 28 are substantially level (coplanar) with the top surfaces 26A of metal pillars 26 and are substantially level (coplanar) with top surface 27A of molding material 27.

Figure 25:
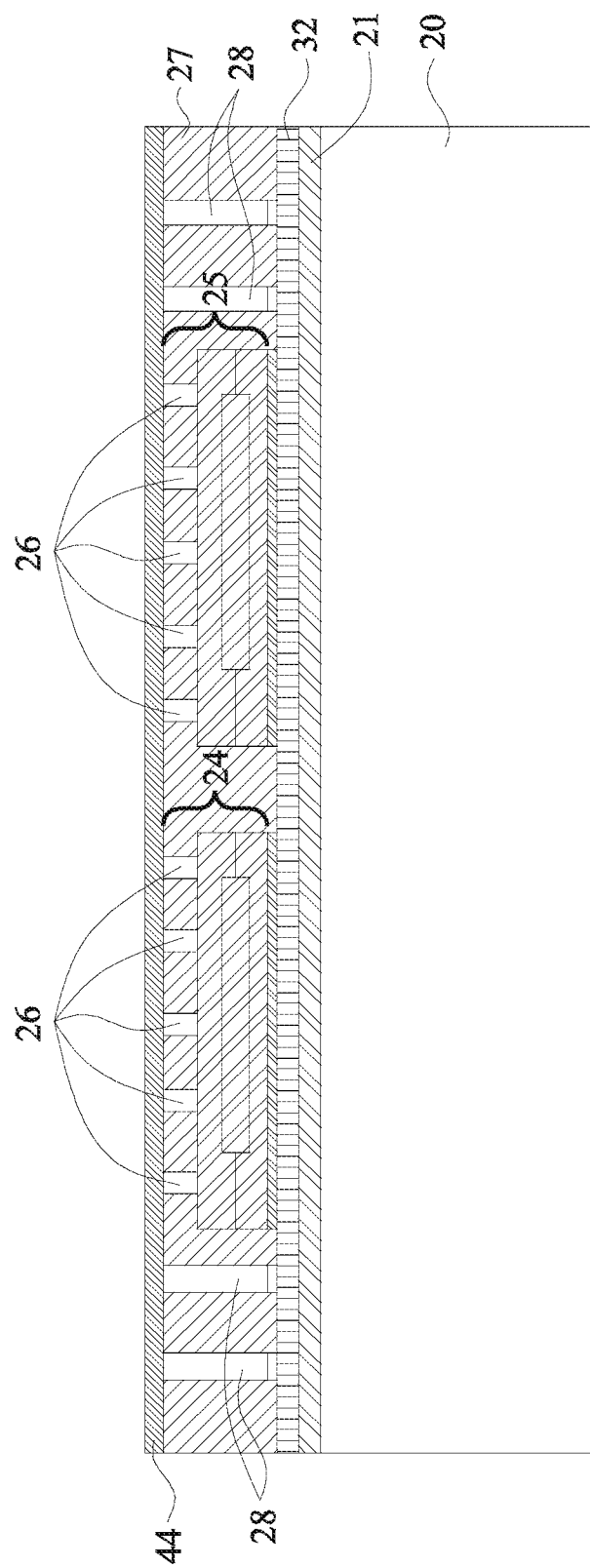

Referring to FIG. 25, dielectric layer 44 is formed over and contacts molding material 27, TAVs 28, and metal pillars 26. In some embodiments, dielectric layer 44 is formed of a polymer such as PBO, polyimide, or the like. In alternative embodiments, dielectric layer 44 is formed of an inorganic dielectric material such as silicon nitride, silicon oxide, silicon oxynitride, or the like.

Figure 26:
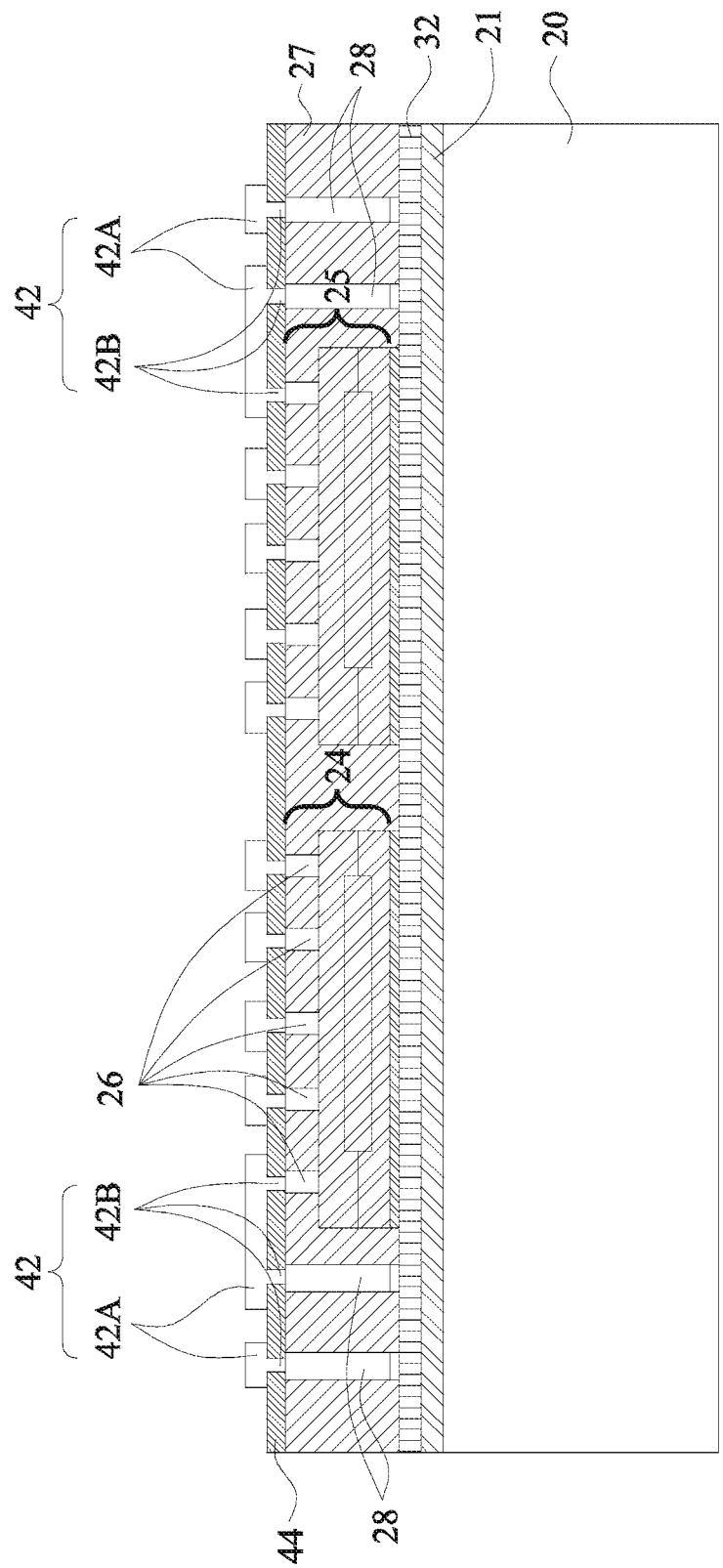

Next, referring to FIG. 26, Redistribution Lines (RDLs) 42 are formed to connect to metal pillars 26 and TAVs 28. RDLs 42 may also interconnect metal pillars 26 and TAVs 28. RDLs 42 include metal traces (metal lines) 42A and vias 42B. Vias 42B are formed in dielectric layer 44 to connect to TAVs 28 and metal pillars 26. In some embodiments, RDLs 42 are formed in a plating process, wherein each of RDLs 42 includes a seed layer (not shown) and a plated metallic material over the seed layer. The seed layer and the plated material may be formed of the same material or different materials.

Figure 27:
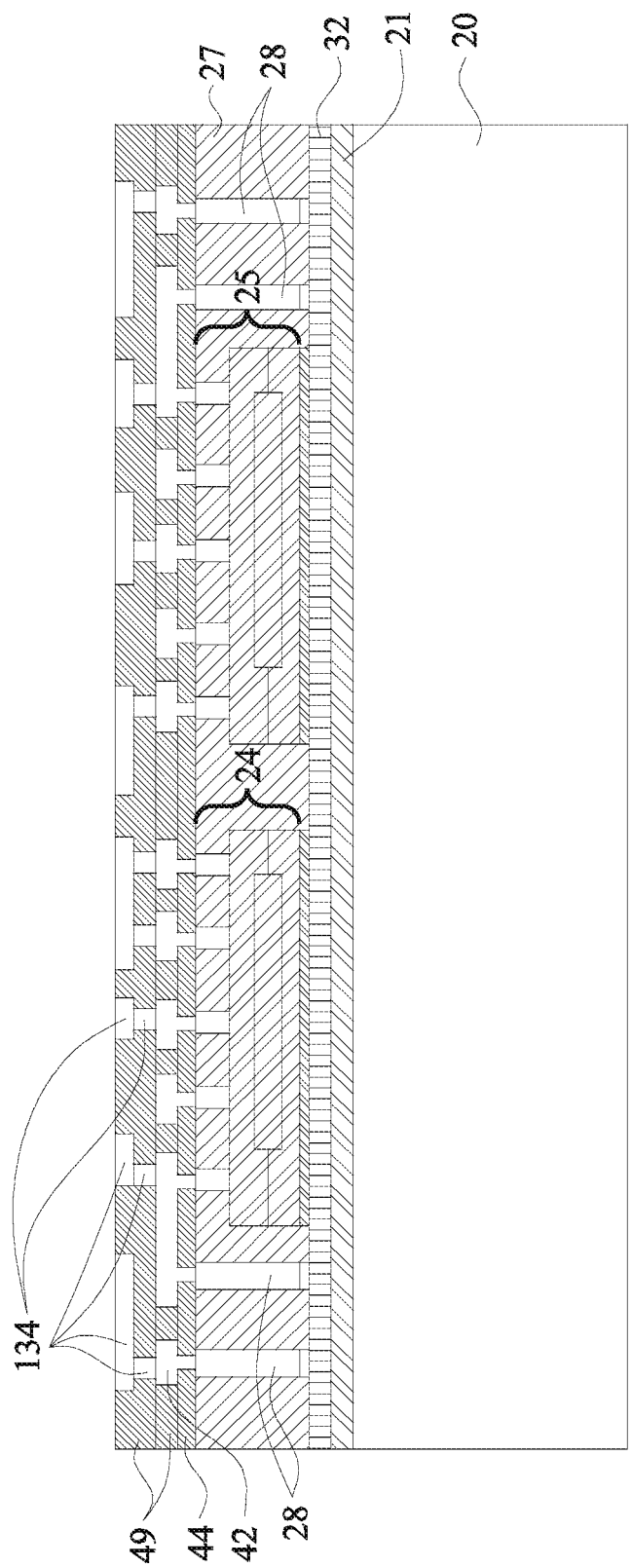

Referring to FIG. 27, in accordance with various embodiments, one or a plurality of dielectric layers 49 are formed over the structure shown in FIG. 26, with RDLs 134 formed in dielectric layers 49 In some embodiments, the formation of each layer of RDLs 134 includes forming a blanket copper seed layer, forming and patterning a mask layer over the blanket copper seed layer, performing a plating to form RDLs 134, removing the mask layer, and performing an etching step to remove the portions of the blanket copper seed layer not covered by RDLs 134. RDLs 134 may comprise a metal or a metal alloy including aluminum, copper, tungsten, and/or alloys thereof.

FIG. 27 illustrates one RDL layer 134, but there may be more than one layer of RDLs 134, depending on the routing requirement of the respective package. Dielectric layers 49 in these embodiments may comprise polymers such as PBO, polyimide, BCB, or the like. Alternatively, dielectric layers 49 may include non-organic dielectric materials such as silicon oxide, silicon nitride, silicon carbide, silicon oxynitride, or the like.

Figure 28:
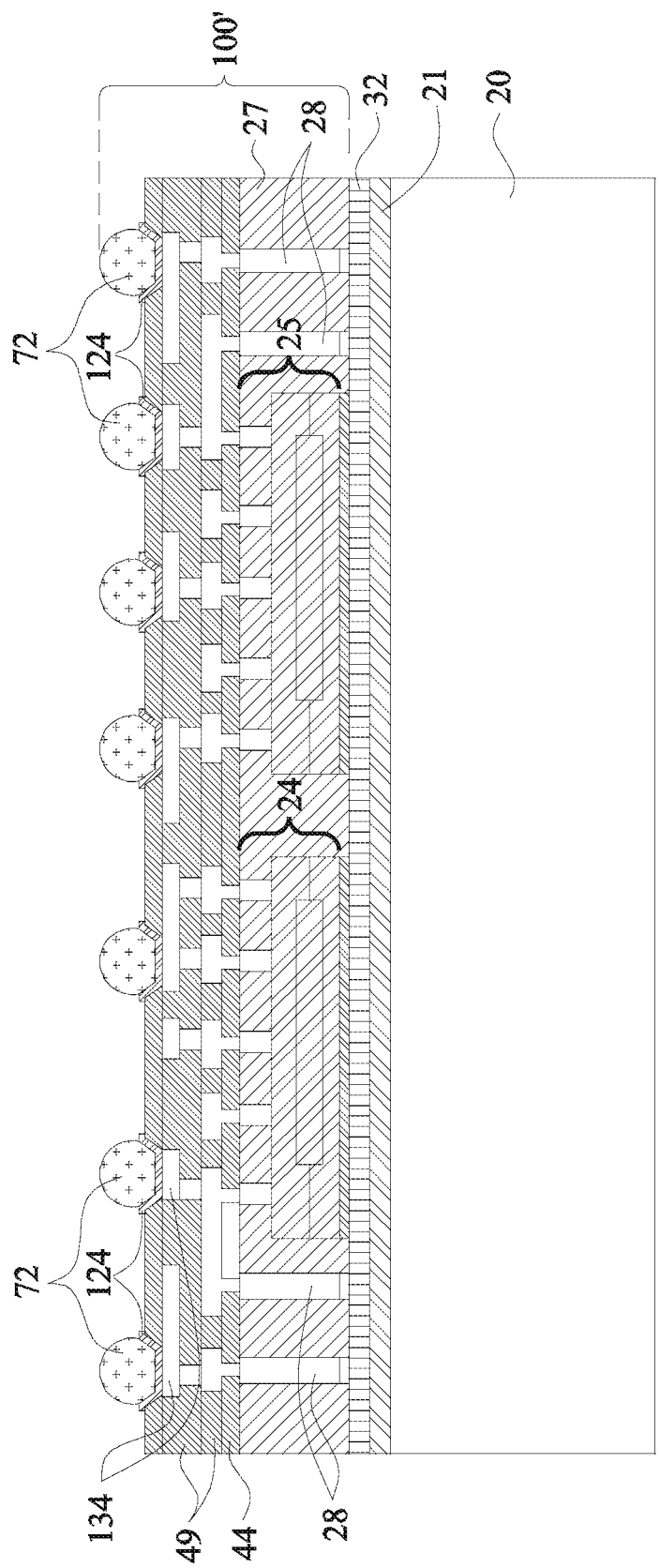

FIG. 28 illustrates the formation of UBMs 124 and electrical connectors 72 in accordance with some exemplary embodiments. The formation of electrical connectors 72 may include placing solder balls on the exposed portions of UBMs 124 and then reflowing the solder balls. In alternative embodiments, the formation of electrical connectors 72 includes performing a plating step to form solder regions over RDLs 134 and then reflowing the solder regions. Electrical connectors 72 may also include metal pillars, or metal pillars and solder caps, which may also be formed through plating. Throughout the description, the combined structure, including device dies 24 and 25, TAVs 28, molding material 27, the overlying RDLs 42 and 134, and dielectric layers 44 and 49, is referred to as package 100, which may be a composite wafer.

Figure 29:
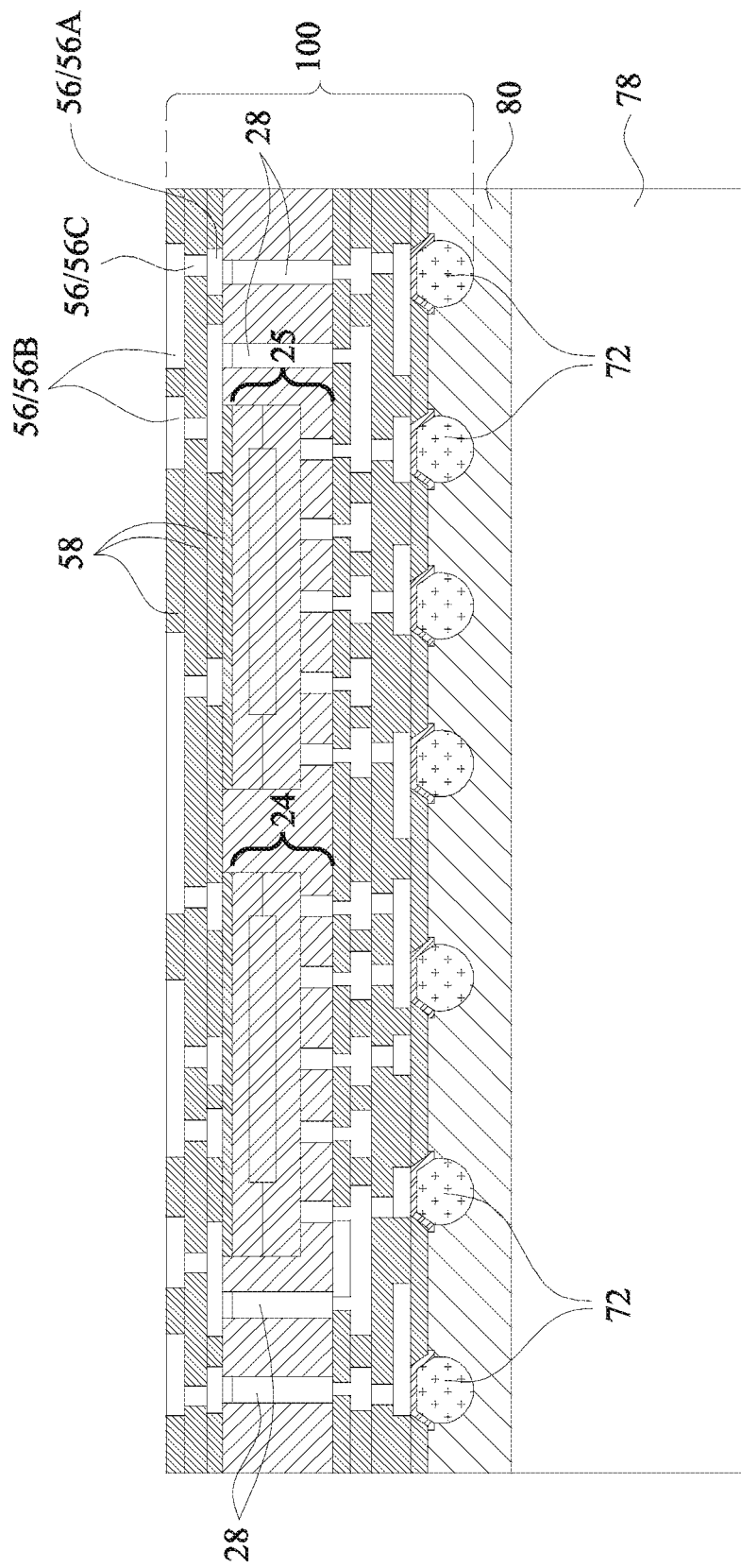

Next, package 100 is de-bonded from carrier 20, for example, by projecting a UV light or a laser on adhesive layer 21. Adhesive layer 21 and buffer layer 32 (if any) are also cleaned from package 100. The resulting structure is shown in FIG. 29. Package 100 is further adhered to carrier 78 through adhesive layer 80, wherein electrical connectors 72 may face toward, and may contact, adhesive 80. Dielectric layers 58 and RDLs 56 are then formed. In accordance with some embodiments of the present disclosure, RDLs 56 may include a single RDL layer, such as the illustrated layer RDL 56A. In alternative embodiments, RDLs 56 include more than one RDL layer such as the illustrated RDLs 56A and 56B, wherein vias (such as 56C) are formed to interconnect different RDL layers. Dielectric layers 58 may also be formed of a polymer such as PBO, BCB, polyimide, or an inorganic material such as silicon oxide, silicon nitride, silicon oxynitride, or the like.

Figure 30:
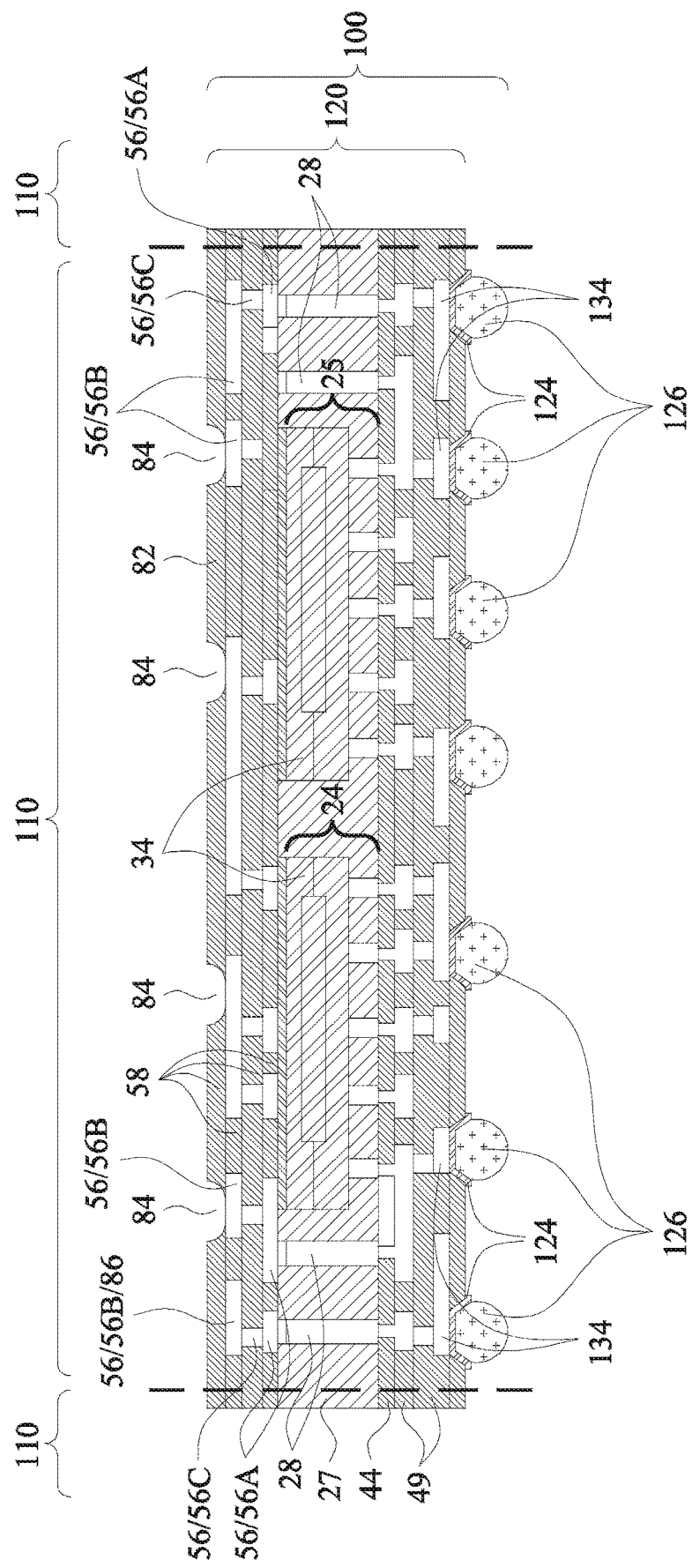

As shown in FIG. 30, dielectric layer 82 is formed over RDLs 56 and dielectric layers 58. Dielectric layer 82 may be formed of PBO or other organic or inorganic materials. Openings 84 are then formed in dielectric layer 82, and hence the metal pads in the top RDLs 56B are exposed.

In accordance with some embodiments of the present disclosure, package 100 may be sawed apart into smaller packages 110. In subsequent steps, package 110 is bonded to package components 200 and/or 300, and the resulting structure is shown in FIG. 17.

Figure 31:
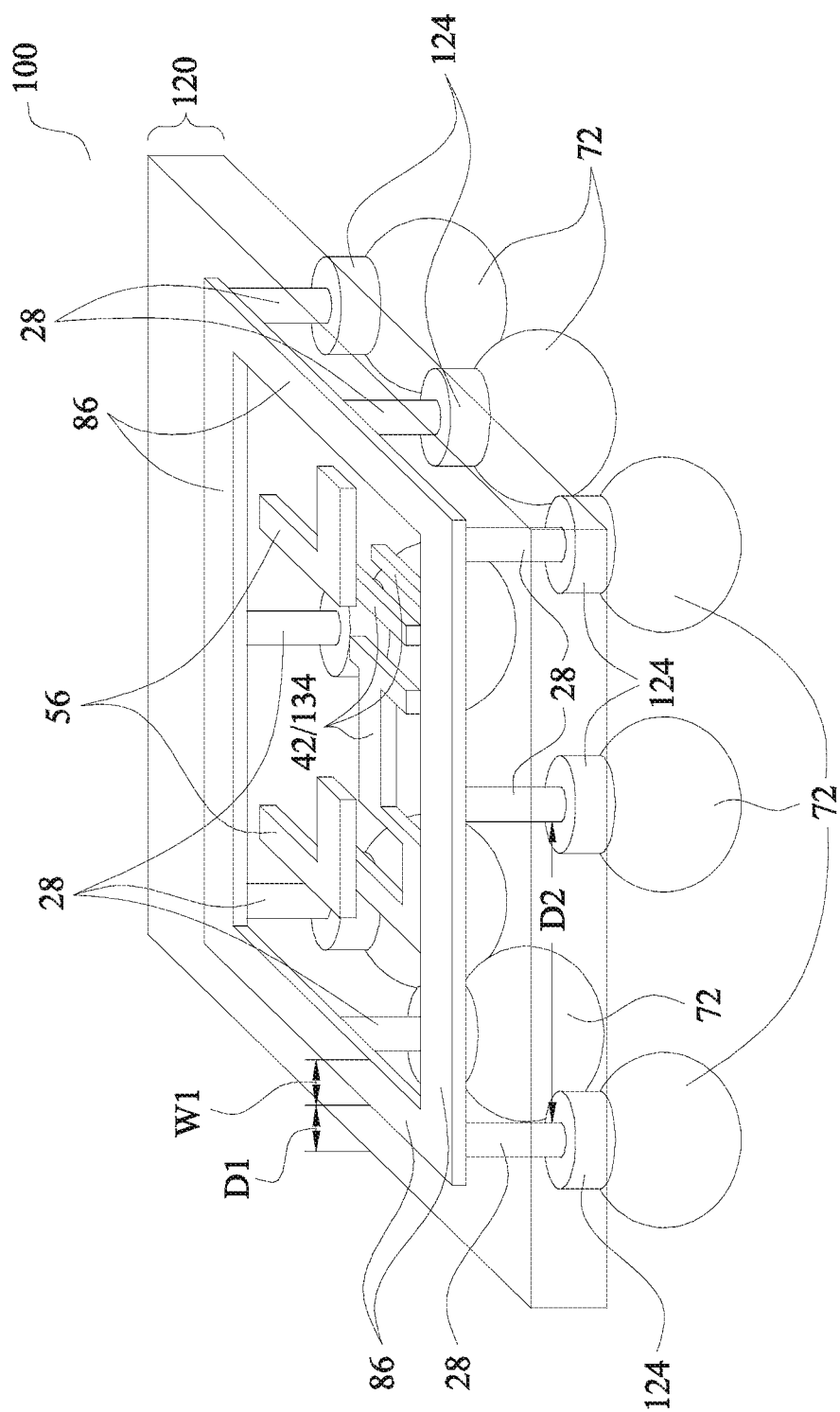
FIGS. 31 through 33 are perspective views of parts of the packages, including metal rings, in accordance with some embodiments.

FIG. 31 schematically illustrates a perspective view of some components in package 110. Package 110 includes body 120, which is also shown in FIG. 30. As shown in FIG. 30, Body 120 includes device dies 24 and 25, molding material 27, TAVs 28, and the RDLs and dielectric layers on the opposite sides of molding material 27. Front-side RDLs 42 and 134 and back-side RDLs 56 are schematically illustrated in FIG. 32.

In FIG. 31, metal ring 86 is illustrated. Metal ring 86 may be formed simultaneously with RDLs 56. In accordance with some embodiments, metal ring 86 is formed simultaneously with the top RDL layer such as the RDL layer 56B in FIG. 30. Accordingly, metal ring 86 may be in the same RDL layer as the metal pads that are in contact with solder regions 206 (FIG. 17). In accordance with alternative embodiments, metal ring 86 is formed in other RDL layers (such as RDL layer 56A in FIG. 30) below the top RDL layer. In accordance with yet alternative embodiments, metal ring 86 extends into a plurality of RDL layers. For example, metal ring 86 may include a first ring in RDL layer 56A (FIG. 30), a second ring in RDL layer 56B that overlaps the first ring, and via(s) 56C connecting the first ring to the second ring. Via(s) 56C may include a plurality of discrete vias or a full via ring. In these embodiments, the metal ring in more than one RDL layer and the via ring therebetween may form an integrated metal ring.

Metal ring 86 includes four sides, as shown in FIG. 31. Each of the four sides is close to one of the sides of package 110. For example, the distance D1 between the sides of metal ring 86 and the respective nearest edge of package 110 may be smaller than about 500 μm. Distance D1 may also be equal to or greater than about 300 μm in order to leave enough margin for the sawing process shown in FIG. 30. Furthermore, the widths W1 of the metal traces that form metal ring 86 may be in the range between about 10 μm and about 50 μm.

Figure 32:
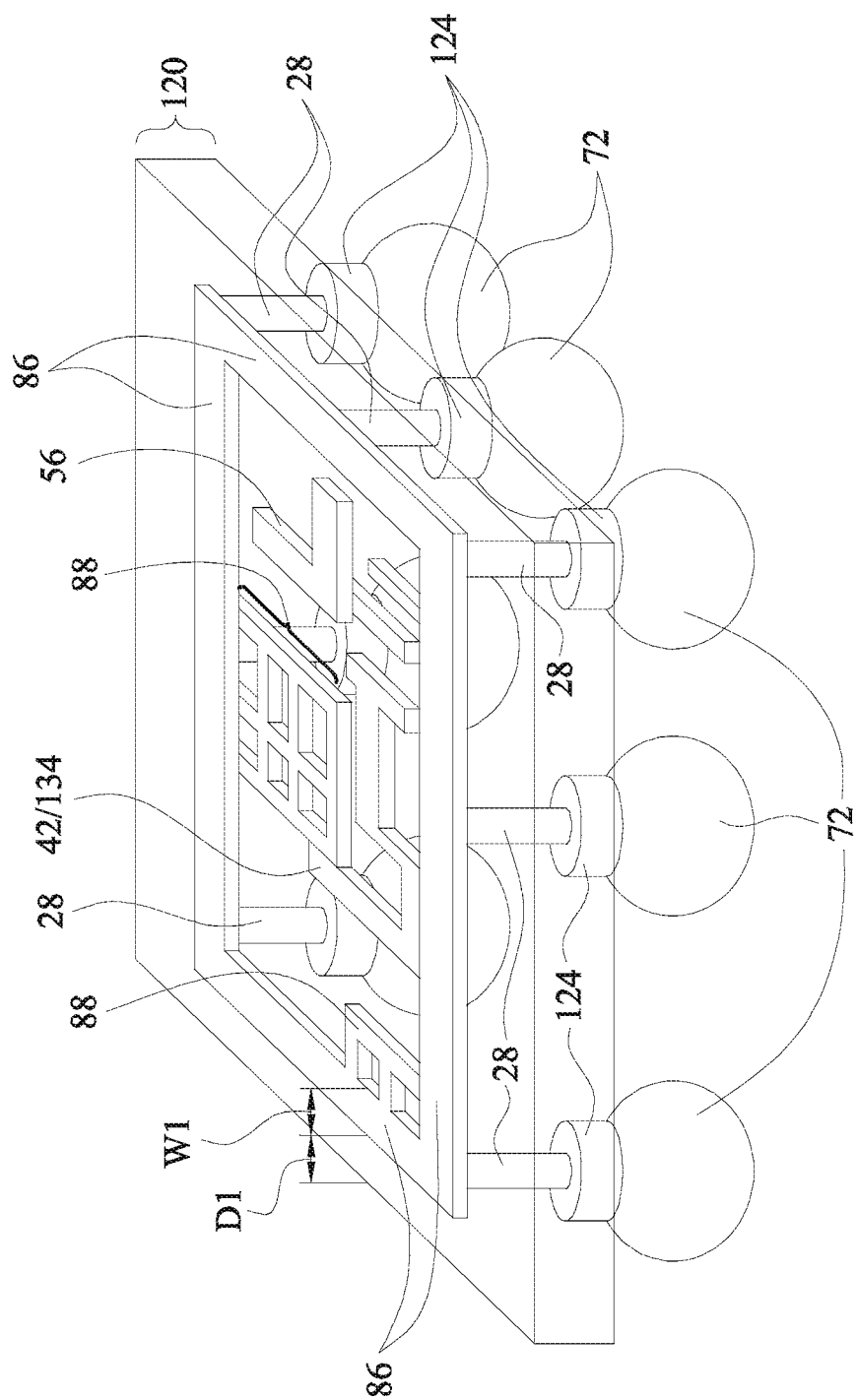

In accordance with some embodiments, a plurality of TAVs 28 are connected to metal ring 86, for example, either directly or through metal vias (not shown in FIG. 32, refer to 56C in FIG. 30). The plurality of TAVs 28 is electrically grounded, and hence is referred to as grounded TAVs 28 hereinafter. Grounded TAVs 28 may be connected to electrical connectors 72 in a one-to-one correspondence. Alternatively, grounded TAVs 28 may be routed to a common electrical connector 72, which is connected to the electrical ground.

The plurality of grounded TAVs 28 may be distributed substantially uniformly and encircling device dies 24/25, signal TAVs 28, and the front-side and backside RDLs 42, 134, and 56. The signal TAVs 28 carry electrical signals and are not grounded. For example, there may be one grounded TAVs 28 aligned to each of the four corners of metal ring 86. In addition, there may be some additional grounded TAVs 28 aligned to the four sides (but not at the corners) of metal ring 86, as also illustrated by TAVs 28.

Being electrically grounded, metal ring 86 and the respective grounded TAVs 28 form a metal shield. The metal shield may reduce the electrical magnetic interference between the features in the metal shield and the devices outside the metal shield. For example, when device dies 24/25 handle radio frequency signals, device 24/25 may adversely affect the function of nearby devices and/or be affected by the nearby devices if the nearby devices emit radio frequency signals. To improve the effectiveness in the electrical magnetic shielding, the distance D2 between neighboring grounded TAVs 28 may be smaller than ½ or ¼ of the wavelength of the EM signal source, which may be in the devices 34 in device dies 24/25 (FIG. 17) or the devices external to package 110. For example, assuming devices 34 processes radio frequency signals with wavelength λ, then all distances between neighboring grounded TAVs 28 may be set to equal to or smaller than ½λ or ¼λ. Each side of metal ring 86 may be connected to 1, 2, 3, or any greater number of grounded TAVs 28 in addition to the grounded TAVs 28 that are aligned to the corners of metal ring 86. Accordingly, the grounded TAVs 28 and the overlying metal ring 86 form a shielding pipe, with device dies 24 and 25 and signal TAVs 28 in the shielding pipe.

FIG. 32 illustrates package 110 in accordance with alternative embodiments. The package in FIG. 32 is similar to the package in FIG. 31, except that additional metal ring extensions 88 are formed. Metal ring extensions 88 may be formed simultaneously as the formation of metal ring 86. Metal ring extensions 88 are connected to metal ring 86, and hence are also electrically grounded. In some embodiments, there are some spaces unoccupied by backside RDLs 56; the spaces can be used to form metal ring extensions 88 in order to improve the effectiveness of electric magnetic shielding. Metal ring extensions 88 may include a plurality of interconnected metal traces, which may form a metal grid in some embodiments.

Figure 33:
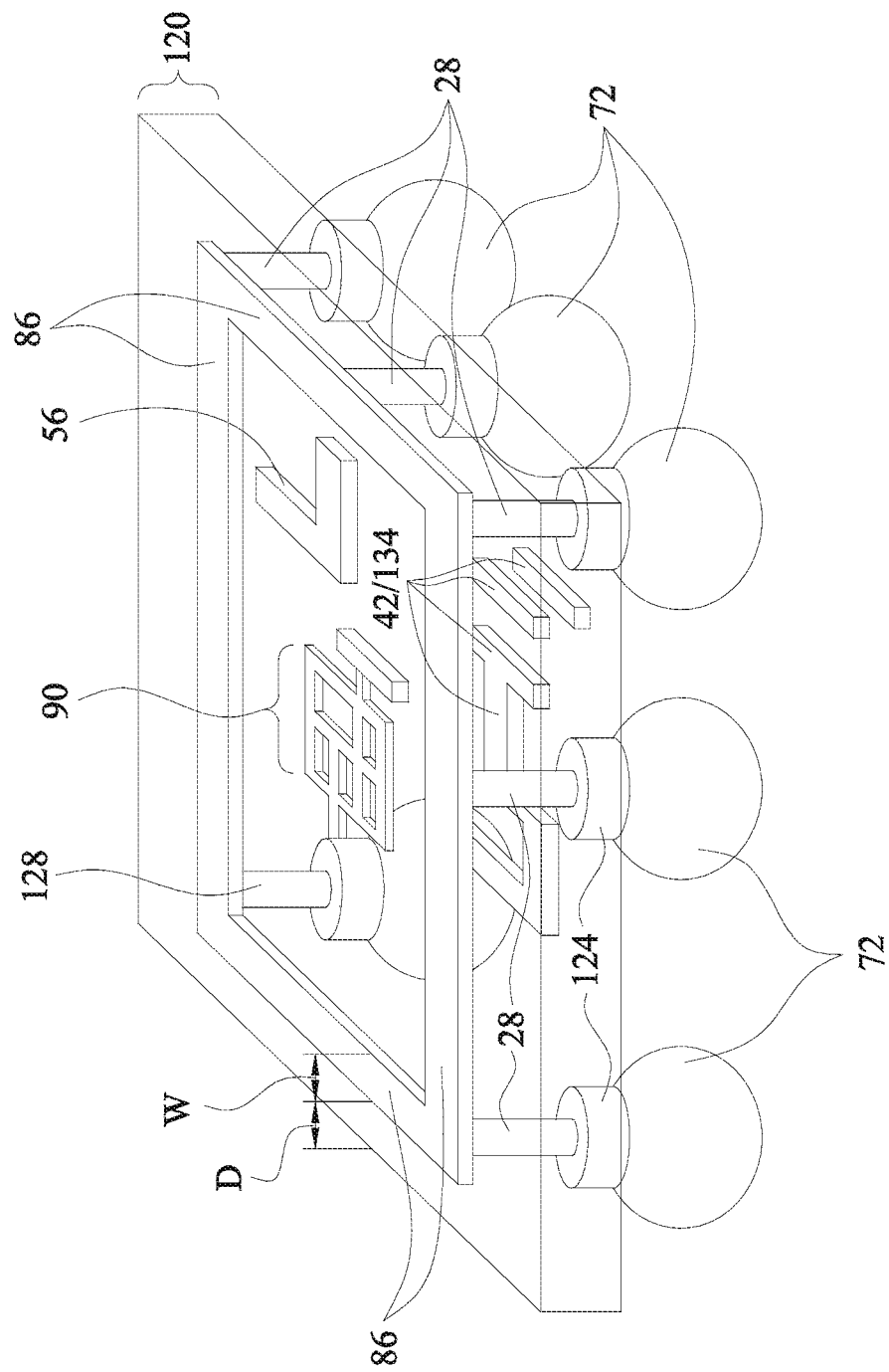

FIG. 33 illustrates package 110 in accordance with alternative embodiments. The structure in FIG. 33 is similar to the structure in FIG. 32, except that an additional metal ring extension 90 is formed. Metal ring extension 90 is similar to metal ring 88 in FIG. 32, except it is formed in the same process step as the formation of front-side RDL 42 and 134.

In the embodiments of the present disclosure, the metal shielding cases are formed in the package processes. The manufacturing cost of forming the metal shielding cases in accordance with the embodiments is lower than the conventional processes, which may include various process steps including stamping, the placement of metal shielding case, and soldering the metal shielding case to PCB. The metal shielding cases may form integrated 3D structures, and hence the space occupied by the resulting package is reduced.

Figure 34:
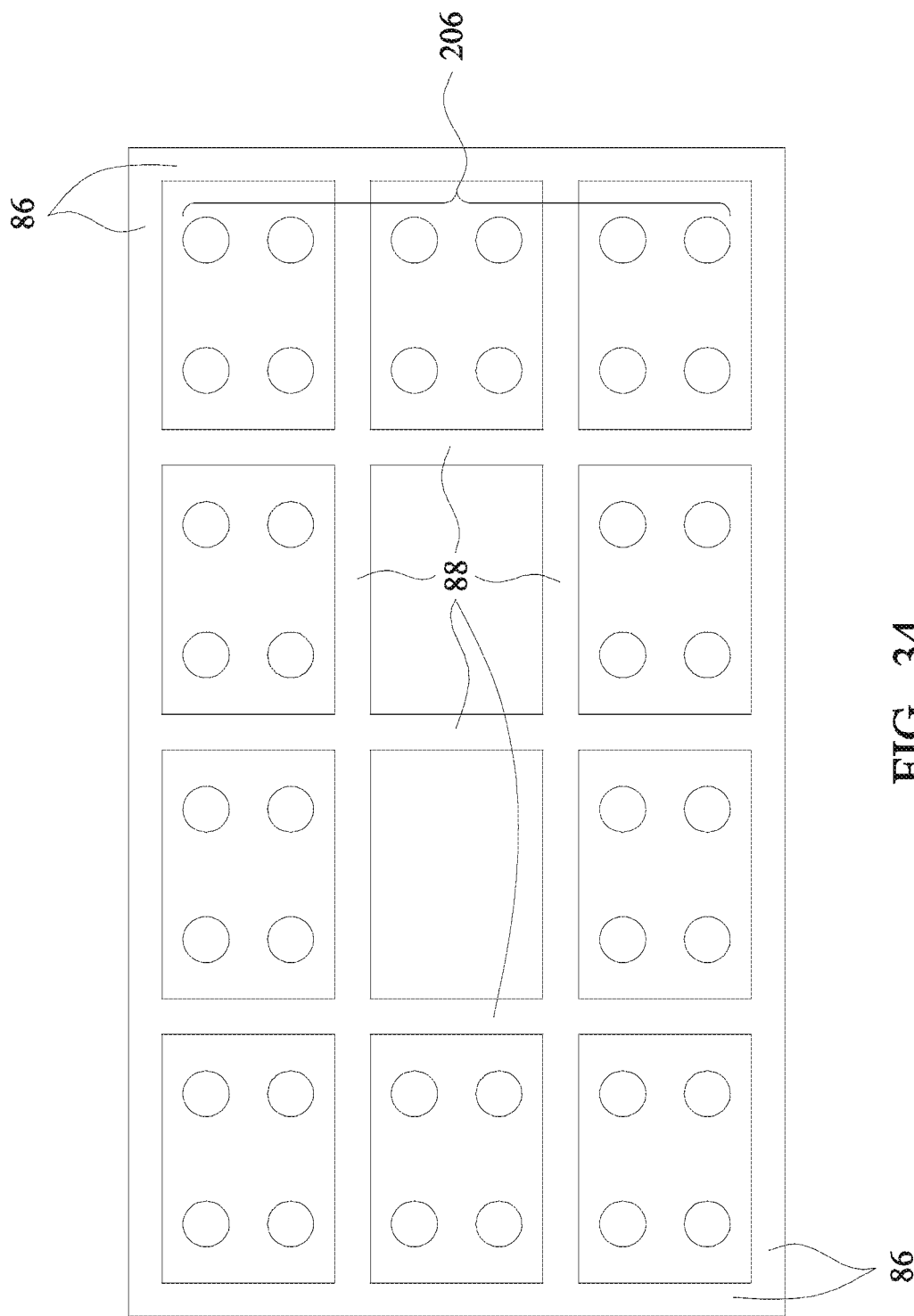
FIG. 34 illustrates a top view of a metal ring and metal ring extensions in accordance with some embodiments.

FIG. 34 illustrates a top view of metal ring 86 in accordance with some exemplary embodiments. In these embodiments, a plurality of metal ring extensions 88 are formed in the region encircled by metal ring 86. Metal ring extensions 88 in these embodiments form a metal grid that covers the entire region encircled by metal ring 86. The metal pads that are used to connect to solder regions 206 (FIG. 1) may be formed between metal ring extensions 88. The metal grid formed of metal ring extensions 88 may have uniform or non-uniform spacing.

The embodiments of the present disclosure have some advantageous features. By forming the metal ring and the grounded TAVs connected to the metal ring, the metal ring and the respective grounded TAVs form a metal shield. The metal shield advantageously reduces the electrical magnetic interference between the features in the metal shield and the devices outside the metal shield.

In accordance with some embodiments of the present disclosure, a package includes a device die, a molding material molding the device die therein, and a through-via penetrating through the molding material. A redistribution line is on a side of the molding material. The redistribution line is electrically coupled to the through-via. A metal ring is close to edges of the package, wherein the metal ring is coplanar with the redistribution line.

In accordance with alternative embodiments of the present disclosure, a package includes a device die, a molding material molding the device die therein, a through-via substantially penetrating through the molding material, and a redistribution line on a side of the molding material. A plurality of through-vias penetrates through the molding material. The plurality of through-vias includes four through-vias, with each of the four through-vias adjacent to one of four corners of the package. The plurality of through-vias is electrically interconnected.

In accordance with yet alternative embodiments of the present disclosure, a package includes a device die, a molding material molding the device die therein, a through-via penetrating through the molding material, and a redistribution line on a side of the molding material. The redistribution line is electrically coupled to the through-via. The package further includes a metal ring with four sides, each close to one of edges of the package, wherein the metal ring is coplanar with the redistribution line. A plurality of through-vias penetrates through the molding material, with the plurality of through-vias electrically coupled to the metal ring. Each corner of the package is adjacent to one of the plurality of through-vias. The package further includes a plurality of solder regions, each adjacent to one of four corners of the package, wherein each of the first plurality of solder regions is connected to one of the first plurality of through-vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a plurality of conductive posts, the plurality of conductive posts comprising a first plurality of conductive posts and a second plurality of conductive posts;
    encapsulating the plurality of conductive posts and a device die in an encapsulating material;
    planarizing the plurality of conductive posts, the device die, and the encapsulating material;
    forming a first plurality of conductive features on a first side of the encapsulating material, wherein the first plurality of conductive features comprises:

first portions electrically coupling to the device die; and
second portions electrically coupling to the plurality of conductive posts; and
forming a second plurality of conductive features on a second side of the encapsulating material, wherein the second plurality of conductive features comprises a conductive ring electrically coupling to the plurality of conductive posts; and
sawing the encapsulating material and overlying and underlying structures to form a package, wherein the first plurality of conductive posts comprises a corner conductive post at each corner of the package, and wherein each of the second plurality of conductive posts is between and aligned to two of the corner conductive posts.

2. The method of claim 1 further comprising electrically grounding the conductive ring.

3. The method of claim 1, wherein forming the second plurality of conductive features further comprises simultaneously forming a plurality of redistribution lines when the conductive ring is formed.

4. The method of claim 1 further comprising forming a plurality of solder regions electrically coupling to the conductive ring.

5. The method of claim 1 further comprising, wherein the conductive ring is formed, forming a conductive ring extension at a same level as the conductive ring, wherein the conductive ring extension is encircled by, and is connected to, the conductive ring.

6. The method of claim 1 further comprising attaching a solder region vertically aligning to each of the corner conductive posts.

7. The method of claim 1, wherein the second plurality of conductive posts is encapsulated in the encapsulating material and is electrically coupled to the conductive ring.

8. A method comprising:
forming first conductive posts and second conductive posts over a substrate;
attaching a device die to the substrate, the second conductive posts being more proximal than the first conductive posts to the device die;
encapsulating the first conductive posts, the second conductive posts, and the device die in a molding material, a top surface of the molding material being level with the first conductive posts, the second conductive posts, and the device die; and
forming first conductive features, second conductive features, and third conductive features over the top surface of the molding material, the first conductive features being electrically coupled to the first conductive posts, the second conductive features electrically coupling the second conductive posts to the device die, and the third conductive features being electrically coupled to the device die.

9. The method of claim 8 further comprising forming a first redistribution structure over the first conductive features, the second conductive features, and the third conductive features.

10. The method of claim 9 further comprising forming under-bump metallurgies (UBMs) over the first redistribution structure.

11. The method of claim 10, wherein the UBMs comprise a first UBM electrically coupled to one of the first conductive features, a second UBM electrically coupled to one of the second conductive features, and a third UBM electrically coupled to one of the third conductive features.

12. The method of claim 8 further comprising forming a second redistribution structure over a bottom surface of the molding material, the bottom surface being opposite of the top surface.

13. The method of claim 12, wherein the second redistribution structure comprises a continuous conductive ring, the continuous conductive ring electrically coupling one of the first conductive posts with another one of the first conductive posts.

14. The method of claim 13, wherein in a plan view the continuous conductive ring overlaps each of the first conductive posts.

15. The method of claim 13 further comprising electrically grounding the conductive ring.

16. A method comprising:
forming a plurality of conductive posts over a first substrate, the plurality of conductive posts comprising inner conductive posts and outer conductive posts, the outer conductive posts forming a non-continuous rectangular ring, the outer conductive posts comprising corner posts being located at corners of the non-continuous rectangular ring, the outer conductive posts further comprising a side post being located between and aligned with each of the corner posts;
attaching a device die to the first substrate;
forming a molding compound around lateral edges of the plurality of conductive posts and the device die, the molding compound having a first side proximal to the first substrate and a second side opposite the first side;
forming a first plurality of conductive features over the second side of the molding compound;
removing the first substrate to expose the first side of the molding compound; and
forming a second plurality of conductive features over the molding compound, the second plurality of conductive features forming a continuous ring, the continuous ring being electrically coupled to each of the outer conductive posts.

17. The method of claim 16 further comprising forming solder regions over the plurality of conductive posts.

18. The method of claim 17, wherein the first plurality of conductive features comprises:
first conductive features electrically coupling the outer conductive posts to the solder regions;
second conductive features electrically coupling the inner conductive posts to the device die; and
third conductive features electrically coupling the device die to the solder regions.

19. The method of claim 18, wherein the second conductive features are coupled to the solder regions.

20. The method of claim 17, wherein the continuous ring is configured to be electrically grounded by one or more of the solder regions.

* * * * *